(12) United States Patent
Suzuki

(10) Patent No.: US 6,788,138 B2
(45) Date of Patent: Sep. 7, 2004

(54) TRANSMISSION POWER CONTROL CIRCUIT

(75) Inventor: Hiroshi Suzuki, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 39 days.

(21) Appl. No.: 10/333,747

(22) PCT Filed: Jul. 17, 2001

(86) PCT No.: PCT/JP01/06190

§ 371 (c)(1),
(2), (4) Date: Jan. 29, 2003

(87) PCT Pub. No.: WO03/009481

PCT Pub. Date: Jan. 30, 2003

(65) Prior Publication Data

US 2004/0012907 A1 Jan. 22, 2004

(51) Int. Cl.$^7$ .............................. H03G 3/20; H03G 5/16; H03G 3/10; H04B 1/04
(52) U.S. Cl. ..................... 330/129; 330/134; 330/279; 455/126
(58) Field of Search ................................ 330/129, 134, 330/279; 455/126

(56) References Cited

U.S. PATENT DOCUMENTS

| | | | |
|---|---|---|---|
| 5,283,533 A | | 2/1994 | Hori |
| 5,376,895 A | * | 12/1994 | Aihara ....................... 330/129 |
| 5,606,285 A | | 2/1997 | Wang et al. |
| 5,655,220 A | * | 8/1997 | Weiland et al. ............... 455/69 |
| 6,670,849 B1 | * | 12/2003 | Damgaard et al. .......... 330/129 |
| 6,701,135 B2 | * | 3/2004 | Posti et al. .................. 455/103 |

FOREIGN PATENT DOCUMENTS

| | | |
|---|---|---|
| GB | 2354384 | 3/2001 |
| JP | 6-169228 | 6/1994 |
| JP | 8-102682 | 4/1996 |
| JP | 9-121132 | 5/1997 |
| JP | 10-28061 | 1/1998 |
| JP | 10-145160 | 5/1998 |
| JP | 11-127084 | 5/1999 |
| JP | 2000-101456 | 4/2000 |
| JP | 2000-349657 | 12/2000 |
| JP | 2001-189667 | 7/2001 |

OTHER PUBLICATIONS

U.S. patent application Publication US 2003/0002452 A1 of Sahota.*

* cited by examiner

Primary Examiner—Patricia Nguyen
(74) Attorney, Agent, or Firm—Oblon, Spivak, McClelland, Maier & Neustadt, P.C.

(57) ABSTRACT

In a transmission power control circuit according to the present invention, a variable gain amplifier (1) amplifies a transmitting wave with a gain corresponding to a control voltage $V_C$ from a power control section (110). When a transmission power ($P_{OUT}$) of the transmitting wave is within a measurable range of a detecting circuit (3), the power control section (110) sets a control voltage feedback ratio (K') to 0 and applies negative feedback to a detection voltage ($V_{DET}$) and thereby, implements close loop control to cause transmission power $P_{OUT}$ to be closer to a designated level. On the other hand, when the transmission power ($P_{OUT}$) is out of a measurable range of the detecting circuit (3), the power control section (110) sets a detection voltage feedback ratio (K) to 0 to generate the control voltage ($V_C$) according to open loop control based on a reference voltage $V_{REF}$.

18 Claims, 16 Drawing Sheets

TRANSMISSION POWER CONTROL CIRCUIT

TECHNICAL FIELD

The present invention relates to a transmission power control circuit, and more particularly, to a transmission power control circuit controlling a transmission power of a transmitting wave using a detector.

BACKGROUND ART

Generally, in a prior art wireless terminal apparatus such as a portable telephone, a feedback control using a detector was performed to control a transmission power of a transmitting wave output.

Referring to FIG. 24, a transmission power control circuit 10 according to a prior art technique included: a variable gain amplifier 1; a distributor 2; a detecting circuit 3; a reference voltage generating circuit 4; and a power control section 5.

Variable gain amplifier 1 amplifies a transmission signal with a gain according to a given control voltage $V_C$ to generate a transmitting wave output. Distributor 2 takes out part of a transmission power $P_{OUT}$ of a transmitting wave output. Detecting circuit 3 detects part of the transmission power obtained by distributor 2 and generates a detection voltage $V_{DET}$ according to transmission power $P_{OUT}$. That is, detection voltage $V_{DET}$ changes according to transmission power $P_{OUT}$.

Reference voltage generating circuit 4 generates a reference voltage $V_{REF}$ corresponding to a designated level of transmission power $P_{OUT}$. Power control section 5 generates control voltage $V_C$ according to a negative-fed back voltage $K_0 \cdot V_{DET}$ obtained by multiplying detection voltage $V_{DEF}$ from detecting circuit 3 by a detection voltage feed-back ratio $K_0$, and to $V_{REF}$ from reference voltage generating circuit 4, based on the following equation (1).

$$V_C = V_{REF} - K_0 \cdot V_{DET} \quad (1)$$

By detecting part of transmission power $P_{OUT}$ of a transmitting wave output using distributor 2 and detecting circuit 3 in such a way to further apply negative-feedback, there can be performed close loop control to cause transmission power $P_{OUT}$ and a designated value $P_{CMD}$ of transmission power to coincide with each other.

To be concrete, in a case where transmission power $P_{OUT}$ is higher than a designated level, detection voltage $V_{DET}$ becomes higher to, in response to this, lower control voltage $V_C$ outputted from power control section 5. As a result, a gain of variable gain amplifier 1 is set small, which works so as to reduce transmission power $P_{OUT}$. To the contrary, in a case where transmission power $P_{OUT}$ is set to a value lower than a designated value, in response control voltage $V_C$ is set high, which works so as to raise transmission power $P_{OUT}$ to be large. By performing such a close loop control, control can be executed so that an error between transmission power $P_{OUT}$ of a transmitting wave output and a designated level is reduced to the least possible value.

Referring to FIG. 25, reference voltage generating circuit 4 includes a transmission power designating section 7; a control section 8; and D/A converter 9. Transmission power designated value $P_{CMD}$ indicating a designated level of a transmission power is converted to reference voltage $V_{REF}$ by control section 8 and D/A converter 9. That is, reference voltage $V_{REF}$ is set in correspondence to transmission power designated value $P_{CMD}$.

Power control section 5 includes: an operational amplifier 10; and resistance elements 11 and 12. Detection voltage $V_{DET}$ from detecting circuit 3 is transmitted to a node N0 corresponding to the inverted input terminal (−terminal) of operational amplifier 10 through resistance element 12. Reference voltage $V_{REF}$ from D/A converter 9 is inputted to the non-inverting input terminal (+terminal) of operational amplifier 10. Resistance element 11 is coupled between the inverted input terminal and the output terminal of operational amplifier 10. Therefore, detection voltage feed-back ratio $K_0$ shown in FIG. 28 is determined according to a ratio between resistance elements 11 and 12.

In such a way, in an architecture of transmission power control circuit 10 according to a prior art technique, it was a precondition that detecting circuit 3 can output a detection voltage corresponding to a transmission power all over a dynamic range of transmission power $P_{OUT}$. However, in a case where a dynamic range of transmission power is set wide, generally, it is rather difficult to broaden a measurable range of detecting circuit 3 than to broaden a dynamic range of a gain of variable gain amplifier 1. With a wider measurable range of detecting circuit 3, a detecting circuit tends to become complex and up-scaled, resulting in a high cost.

DISCLOSURE OF THE INVENTION

It is an object of the present invention is to provide a transmission power control circuit capable of ensuring a wide dynamic range of transmission power using a general inexpensive detecting circuit having a simple architecture.

According to the present invention, a transmission power control circuit includes: a variable gain amplifier for amplifying a transmission signal with a gain according to a control voltage to output a transmitting wave; a distributing section for taking out part of the transmitting wave; a detecting section for detecting an output of said distributing section to generate a detection voltage corresponding to a transmission power of the transmitting wave; and a control section receiving an electrical signal indicating a designated level of the transmission power and the detection voltage to set the control voltage. The control section performs a changeover between a first control state setting the control voltage by close loop control according to the detection voltage negative-fed back, multiplied by a feedback ratio and a reference voltage corresponding to the designated level, and a second control state setting the control voltage by open loop control according to the designated level, according to a relationship between a measurable power range of the detecting section and the transmission power.

The control section preferably performs the changeover between the first and second control states according to the detection voltage.

Furthermore, the control section preferably performs the changeover between the first and second control states according to a designated level of the transmission power.

Moreover, the control section preferably includes: a first signal converting section converting a detection voltage to a first digital signal; a control computing section receiving a second digital signal indicating a designated level of a transmission power and the first signal to perform a digital computing for setting a control voltage based on one of the first and second control state, which is selected according to comparison between the first and second digital signals; and a second signal converting section converting an output of the control computing section to an analog signal to generate the control voltage.

In such a transmission power control circuit, relationships between a designated level of a transmission power and a reference voltage are not set separately inside and outside a measurable range of the detecting circuit but a dynamic range of a transmission power can be widely ensured using a detecting section with a general architecture.

Furthermore, the control section preferably includes: a feedback ratio adjusting section for gradually reducing a feedback ratio from a prescribed level as a transmission power comes closer to a non-measurable power range in a prescribed boundary range between a measurable power range and non-measurable power range of a detection section in the first control state.

As a result, a sudden change can be prevented in a transmission power in a prescribed boundary range corresponding to a changeover region between the first control state and second control state.

The feedback ratio adjusting section more preferably changes a feedback ratio according to a detection voltage.

The feedback ratio adjusting section more preferably changes a feedback ratio according to a designated level of a transmission power.

The control section more preferably further includes: a first signal converting section converting a detection voltage to a first digital signal; and a second signal converting section converting an output of the feedback ratio adjusting section to an analog signal to generate a control voltage. The feedback ratio adjusting section receives a second digital signal indicating a designated level of a transmission power and a first digital signal to perform a digital computing for setting a control voltage based on a feedback ratio set according to the second digital signal.

According to the present invention, the transmission power control circuit includes: a variable gain amplifier amplifying a transmission signal with a gain according to a control voltage to output a transmitting wave; a plurality of distributing sections for taking out part of the transmitting wave; and a plurality of detecting sections, provided corresponding to each of the plurality of distributing sections, respectively, and having different measurable power ranges. The plurality of detecting sections detect outputs of the corresponding distributing sections to generate a plurality of detection voltages according to a transmission power of the transmitting wave. The transmission power control circuit further includes: a control section receiving an electrical signal indicating a designated level of a transmission power and a plurality of detection voltages to set a control voltage. The control section includes: a feedback ratio control section setting a plurality of feedback ratios corresponding to the plurality of detection voltages, respectively, according to a relationship between the measurable power ranges of the plurality of detecting sections and a transmission power. The control section sets a control voltage according to close loop control based on a plurality of detection voltages negative-fed back multiplying each of the plurality of feedback ratios and a reference voltage corresponding to a designated level of a transmission power.

The measurable power ranges of at least part of the plurality of detecting sections preferably share an overlapped range between any two and the feedback ratio control section, when the transmission power of a transmitting wave corresponds to an overlapped range, sets the feedback ratios so that the detecting voltages from the detecting circuits sharing the overlapped range are synthesized and negative-fed back.

The feedback ratio control section, when the transmission power of a transmitting wave corresponds to an overlapped region, sets a plurality of feedback ratios so that a synthesis ratio between the plurality of detecting voltages to be synthesized gradually change according to the transmission power.

Such a transmission power control circuit can implement close loop control with a detective voltage in order to ensure a dynamic range of a transmission power to be wide without increasing a measurable range of each of the plurality of detecting sections, that is by using a plurality of common inexpensive detecting sections. Furthermore, a discontinuous change in transmission power can be prevented in changeover between mainly used detecting circuits according to a relationship between a measurable range of each of the detecting circuits and a detection voltage.

The feedback ratio adjusting section preferably sets a plurality of feedback ratios according to a plurality of detection voltages.

Furthermore, the feedback ratio adjusting section preferably sets a plurality of feedback ratios according to a designated level of a transmission power.

The control section preferably further includes: a first signal converting section for converting a plurality of detection voltages to a plurality of first digital signals; and a second signal converting section converting an output of the feedback ratio adjusting section to an analog signal to generate a control voltage. The feedback ratio adjusting section receives a second digital signal indicating a designated level of a transmission power and a plurality of first digital signals to perform a digital computing for setting a control voltage based on a plurality of feedback ratios set according to a plurality of second digital signals.

The control section, when a transmission power does not belong to any of the measurable power ranges of a plurality of detecting sections, preferably temporarily ceases close loop control and sets a control voltage based on open loop control corresponding to a designated level of a transmission power.

Such a transmission control circuit can further control a transmission power based on open loop control of the transmission power at a designated level of transmission power in a range in which the transmission power does not correspond to any of measurable ranges of a plurality of detecting sections. Therefore, a transmission power can be stably controlled without setting relationships between a designated level of a transmission power and a reference voltage separately inside and outside a measurable range of a detecting circuit.

When an actual transmission power $P_{OUT}$ belongs to one of measurable ranges of detecting circuits, similar to the transmission power control circuit according to the third embodiment, such a transmission power control circuit can implement close loop control with a detective voltage in order to ensure a dynamic range of a transmission power to be wide without increasing a measurable range of each of the plurality of detecting sections, that is by using a plurality of common inexpensive detecting sections. Furthermore, a discontinuous change in transmission power can be prevented in changeover between mainly used detecting circuits according to a relationship between a measurable range of each of the detecting circuits and a detection voltage.

The control section more preferably performs a changeover between close loop control and open loop control and setting of a plurality of feedback ratios in close loop control according to a plurality of detection voltages.

The control section more preferably performs a changeover between close loop control and open loop control and setting of a plurality of feedback ratios in close loop control according to a designated level of a transmission power.

The control section more preferably further includes: a first signal converting section converting a plurality of detection voltages to each of the plurality of first digital signals; and a second signal converting section converting an output of the feedback ratio adjusting section to an analog signal to generate a control voltage. The feedback ratio adjusting section receives a second digital signal indicating a designated level of a transmission power and a plurality of first digital signals to perform a digital computing for setting a control voltage using a plurality of feedback ratios set according to a plurality of second digital signals, based on one of open loop control and close loop control, which is selected according to comparison between first and second digital signals.

BEST MODE FOR CARRYING OUT THE INVENTION

Detailed descriptions will be given of transmission power control circuits according to embodiments of the present invention with reference to the accompanying drawings. Note that the same symbols are attached to the same or corresponding constitutes in the figures and none of descriptions thereof is repeated.

First Embodiment

Figure 1:
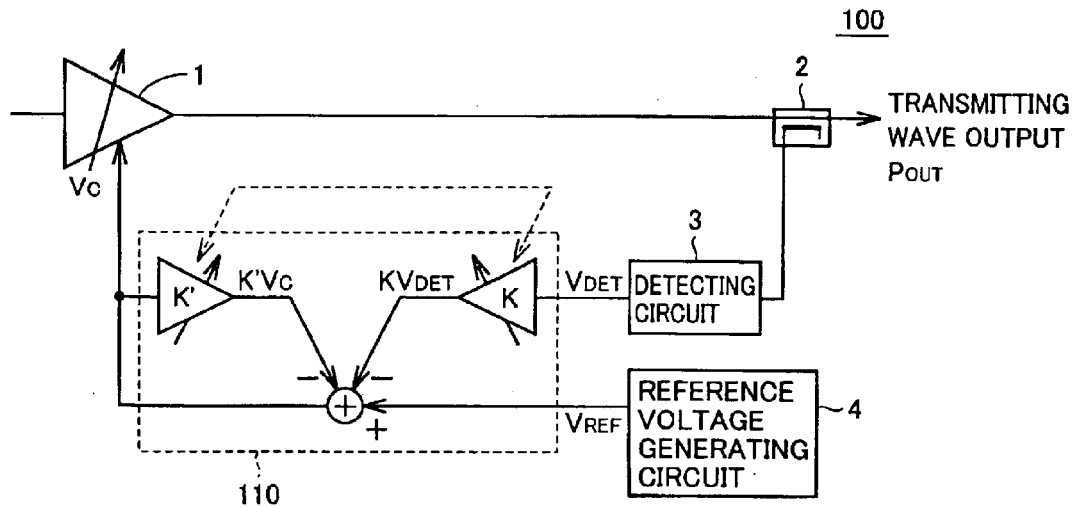
FIG. 1 is a conceptual diagram showing a basic idea of a transmission power control circuit according to the present invention.

Referring to FIG. 1, a transmission power control circuit 100 according to the present invention includes: a variable gain amplifier 1, a distributor 2, a detecting circuit 3; a reference voltage generating circuit 4 and a power control section 110.

Figure 24:
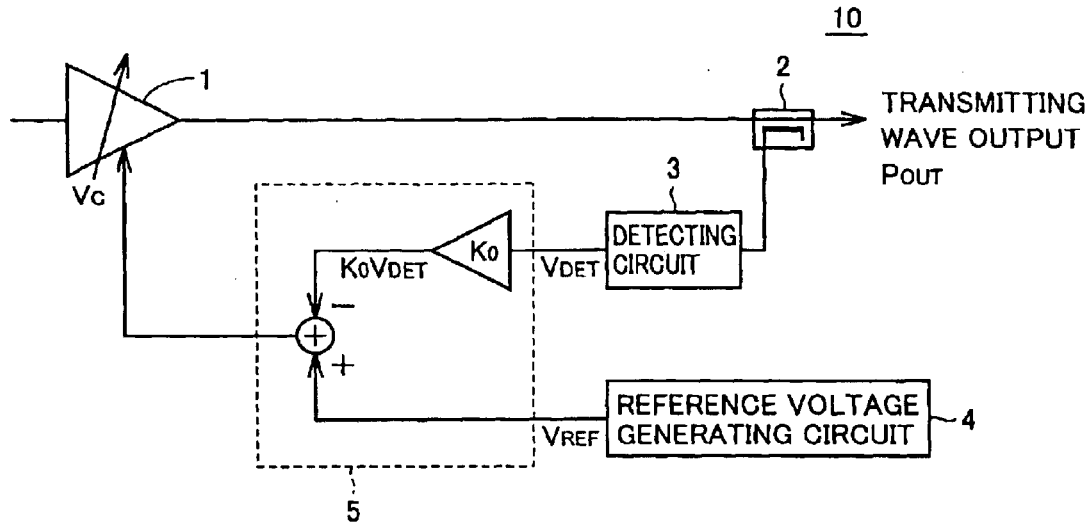
FIG. 24 is a simplified block diagram showing an architecture of a general transmission power control circuit according to a prior art.

As described in FIG. 24, variable gain amplifier 1 amplifies a transmitting wave with a gain according to a control voltage $V_C$ from power control section 110 to generate a transmitting wave output. Distributor 2 takes out part of a transmission power $P_{OUT}$ from the transmitting wave output. Detecting circuit 3 detects the part of a transmission power obtained by distributor 2 to generate a detection voltage $V_{DET}$ corresponding to transmission power $P_{OUT}$. Reference voltage generating circuit 4 generates a reference voltage $V_{REF}$ according to a designated level of transmission power $P_{OUT}$.

In power control section 110, a detection voltage feedback ratio K and control voltage feedback ratio K' are set in an interlocked manner according to a relationship between transmission power $P_{OUT}$ and a measurable range of detecting circuit 3.

Power control section 110 generates a control voltage $V_C$ according to the following equation (2) based on reference voltage $V_{REF}$, detection voltage $V_{DET}$ and control voltage $V_C$.

$$V_C = V_{REF} - (K \cdot V_{DET} + K' \cdot V_C) \tag{2}$$

When transmission power $P_{OUT}$ is within a measurable range of detecting circuit 3, close loop control for causing transmission power $P_{OUT}$ to be closer to a designated level can be realized similarly to the equation (1) by setting control voltage feedback ratio K' to 0 with negative-fed back of detection voltage $V_{DET}$ from detecting circuit 3.

On the other hand, when transmission power $P_{OUT}$ is outside a measurable range of a detecting circuit 3, detection voltage feedback ratio K is set to 0. As a result of the setting, since a relation that $V_{REF}-K'\cdot V_C=V_C$ is established, control voltage $V_C$ in this case is set as shown in the following equation (3).

$$V_C=V_{REF}/(1+K') \qquad (3)$$

As a result, control voltage $V_C$ is generated by open loop control based on reference voltage $V_{REF}$.

In a transmission power control circuit, a relationship between a transmission power designated value $P_{CMD}$ and reference voltage $V_{REF}$ has been determined on a precondition that negative-feedback through detecting circuit 3 has been performed. Therefore, when transmission power $P_{OUT}$ is outside a measurable range of a detecting circuit 3, transmission power $P_{OUT}$ of a transmitting wave output controlled based on reference voltage $V_{REF}$ produces large error from transmission power designated value $P_{CMD}$ if negative-feedback from detecting circuit 3 is simply cut off.

In order to avoid this, if negative-feedback from detecting circuit 3 is cut off when transmission power $P_{OUT}$ of a transmitting wave output is outside a measurable range (in a non-measurable range) of detecting circuit 3, control voltage $V_C$ is generated using a product of control voltage $V_C$ and control voltage feedback ratio K' as a substitute for the cut-off of the negative-feedback to generate control voltage $V_C$. Thereby, it is not necessary to set relationships between transmission power designated value $P_{CMD}$ and reference voltage $V_{REF}$ separately inside and outside a measurable range of detecting circuit 3.

Figure 4:
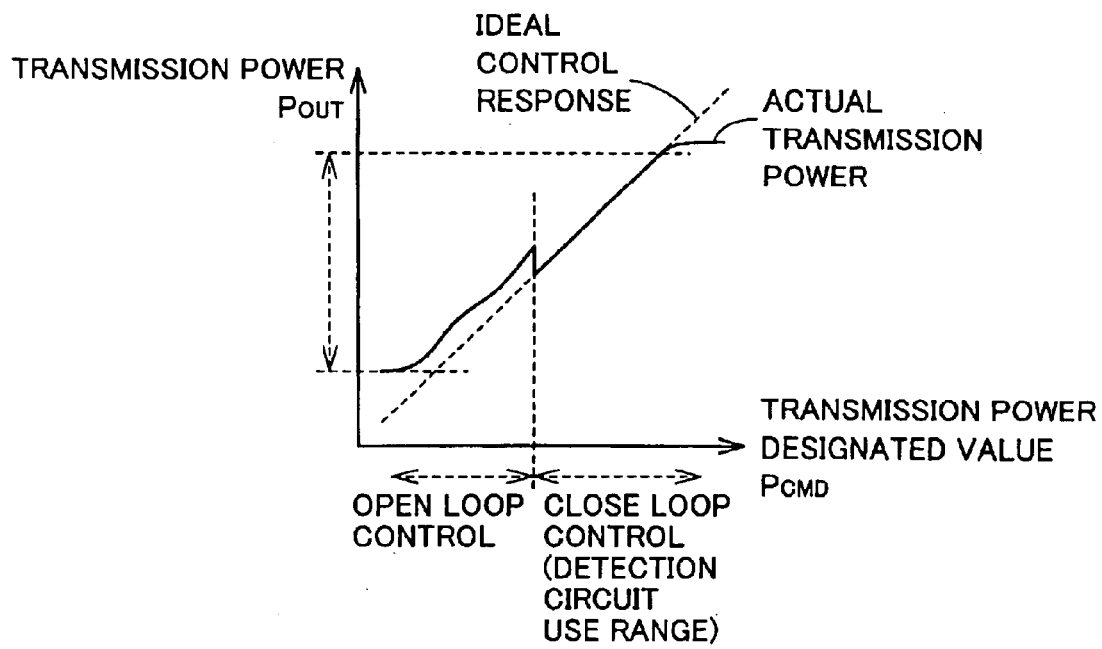
FIG. 4 is a conceptual graph showing a transmission power control characteristic according to the first embodiment.

Referring to FIG. 4, a transmission power control circuit 101a according to the first embodiment includes: variable gain amplifier 1, distributor 2; detecting circuit 3; reference voltage generating circuit 4 and a power control section 120a.

Figure 25:
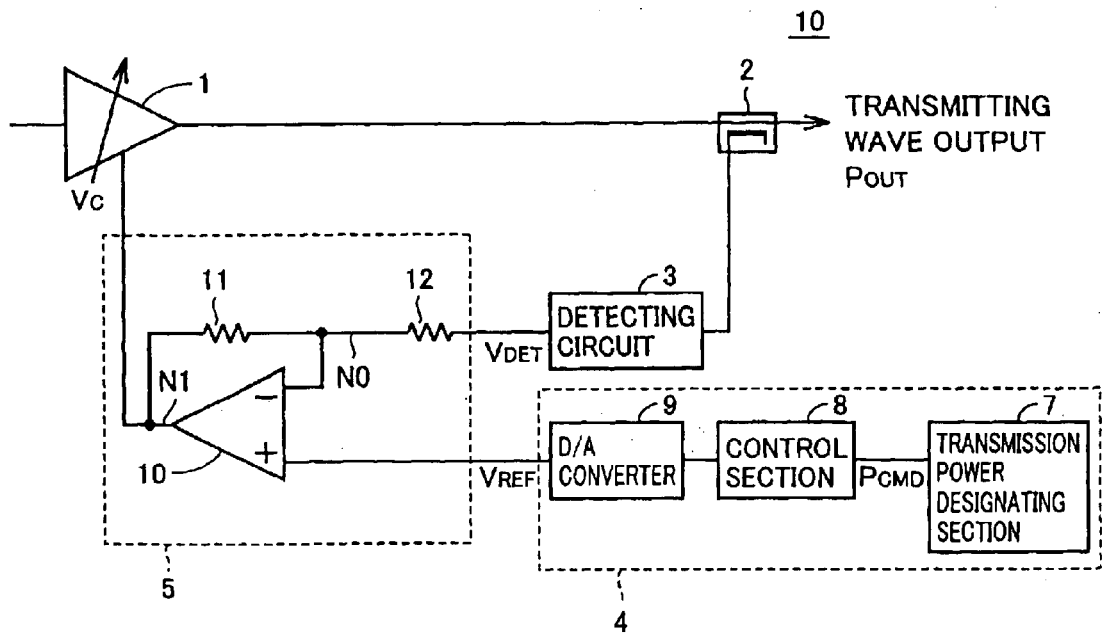
FIG. 25 is a diagram for describing a more detailed architecture of the transmission power control circuit according to a prior art shown in FIG. 24.

Reference voltage generating circuit 4, similar to the architecture shown in FIG. 25, includes: transmission power designating section 7; control section 8 and D/A converter 9. Transmission power designating section 7 generates transmission power designated value $P_{CMD}$ indicating a designated level of a transmission power. Control section 8 generates a digital signal corresponding to a transmission power designated value $P_{CMD}$ from transmission power designating section 7. D/A converter 9 generates reference voltage $V_{REF}$ having an analog voltage corresponding to a digital signal from control section 8.

Power control section 120a includes: a threshold voltage generating circuit 121, a comparator 122, inverter 123, control state changeover switches 124 and 125; an operational amplifier 126; and resistance elements R1 to R3.

Threshold voltage generating circuit generating a threshold voltage $V_{TH}$ for determining whether or not transmission power $P_{OUT}$ is inside a measurable range of detecting circuit 3 based on detection voltage $V_{DET}$. Comparator 122 compares threshold voltage $V_{TH}$ from threshold voltage generating circuit 121 and detection voltage $V_{DET}$ from detecting circuit 3 with each other.

To be concrete, when detection voltage $V_{DET}$ is larger than threshold voltage $V_{TH}$, that is when it is determined that transmission power $P_{OUT}$ falls within a measurable range of detection circuit 3, an output of comparator 122 is set at H level. On the other hand, when detection voltage $V_{DET}$ is lower than threshold voltage $V_{TH}$, that is when it is determined that transmission power $P_{OUT}$ falls outside the measurable range of detection circuit 3, an output of comparator 122 is set at L level.

Reference voltage $V_{REF}$ from D/A converter 9 is inputted to the non-inverting input terminal of operational amplifier 126. Resistance element R1 is coupled between the inverted input terminal and the output terminal of operational amplifier 126. Control voltage $V_C$ generated at the output terminal of operational amplifier 126 is transmitted to variable gain amplifier 1.

Control state changeover switch 124 and resistance element R2 are coupled in series between the inverted input terminal of operational amplifier 126 and detecting circuit 3. Control state changeover switch 125 and resistance element R3 are coupled in series between the inverted input terminal of operational amplifier 126 and ground voltage GND.

Control state changeover switches 124 and 125 are complementarily turned on/off corresponding to an output of comparator 122. When it is determined that transmission power $P_{OUT}$ falls within a measurable range of detection circuit 3, that is when an output of comparator 122 is set at H level, control state changeover switch 124 is turned on, while control state changeover switch 125 is turned off.

As a result, detection voltage $V_{DEF}$ as negative-feedback is inputted to operational amplifier 126 through resistance element R2. Therefore, a close loop control system is formed in which control voltage $V_C$ is corrected each time according to actual transmission power $P_{OUT}$.

On the other hand, when it is determined that transmission power $P_{OUT}$ falls outside a measurable range of detection circuit 3, that is when an output of comparator 122 is set at L level, control state changeover switch 125 is turned on, while control state changeover switch 124 is turned off.

Detection voltage $V_{DET}$ is not transmitted to the inverted input terminal of operational amplifier 126 and operation amplifier 126 operates as a non-inverting amplifier with reference voltage $V_{REF}$ from D/A converter as only one input. Therefore, control voltage $V_C$ is generated by an open loop control system only following to reference voltage $V_{REF}$, that is transmission power designated value $P_{CMD}$.

Figure 2:
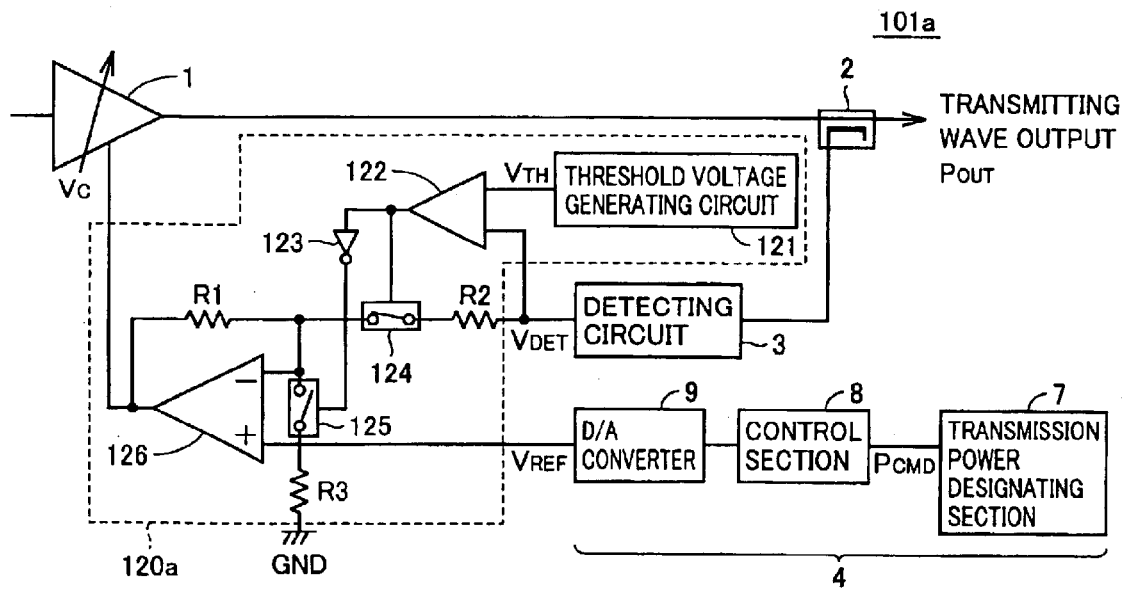
FIG. 2 is a block diagram showing an architecture of a transmission power control circuit according to a first embodiment of the present invention.
Figure 3:
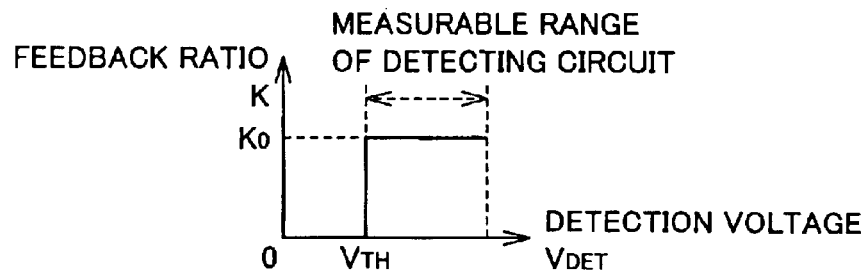
FIG. 3 is a conceptual graph for describing setting of a detection voltage feedback ratio by a power control section shown in FIG. 2.

Referring to FIG. 3, power control section 120a changes setting of detection voltage feedback ratio K according to a level of detection voltage $V_{DET}$. That is, power control section 120a, when detection voltage $V_{DET}$ is higher than threshold voltage $V_{TH}$, determines that transmission power $P_{OUT}$ is within a measurable range of detecting circuit 3 to set detection voltage feedback ratio K to $K_0$. Resistance values of resistance elements R1 and R2 shown in FIG. 2 are designed so as to attain a prescribed feedback ratio $K_0$.

On the other hand, power control section 120a, when detection voltage $V_{DET}$ is lower than threshold voltage $V_{TH}$, determines that transmission power $P_{OUT}$ is outside a measurable range of detecting circuit 3 to set detection voltage feedback ratio K to 0. That is, negative-feedback of detection voltage $V_{DET}$ is temporarily ceased to perform open loop control. A resistance value of resistance element R3 shown in FIG. 2 is designed in consideration of a relationship between reference voltage $V_{REF}$ and transmission power $P_{OUT}$ in open loop control.

Referring to FIG. 4, open loop control and close loop control are changed over therebetween based on detection voltage $V_{DET}$ according to transmission power $P_{OUT}$. Within a close loop control range corresponding to inside a measurable range of detecting circuit 3, approximate coincidence occurs between an ideal control response indicated with a dotted line and an actual transmission power indicated with a solid line because of negative-feedback of detection voltage $V_{DET}$.

On the other hand, within an open loop control range corresponding to outside a measurable range of detecting circuit 3, a gain of variable gain amplifier 1 is set according to transmission power designated value $P_{CMD}$.

Therefore, no necessity arises for selectively using one of relationships between transmission power designated value $P_{CMD}$ and reference voltage $V_{REF}$ according to an inside/outside measurable range of detecting circuit 3, thereby enabling simplification of an architecture of control section 8.

As described above, in a transmission power control circuit according to the first embodiment, in a case where, for example, high control precision is required only in a relatively large range of transmission power $P_{OUT}$ but low control precision is allowed in a relatively small range of transmission power $P_{OUT}$, a dynamic range of transmission power can be ensured wide without increasing a measurable range of a detecting circuit, that is using a general inexpensive detecting circuit.

First Modification of First Embodiment

Figure 5:
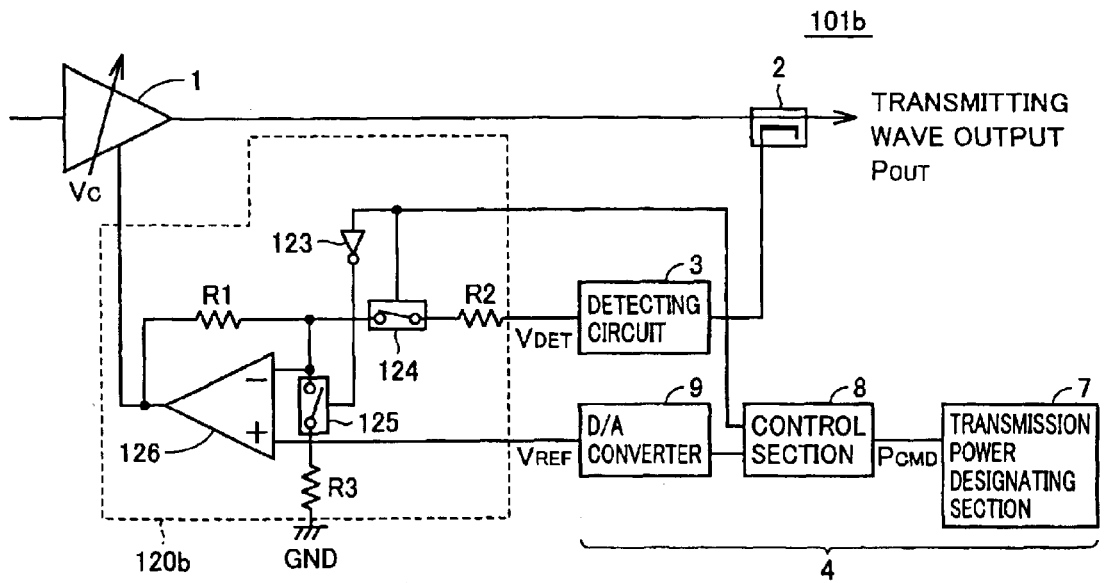
FIG. 5 is a block diagram showing an architecture of a transmission power control circuit according a first modification of the first embodiment of the present invention.

Referring to FIG. 5, a transmission power control circuit 101b according to a first modification of the first embodiment is different from transmission power control circuit 101a shown in FIG. 2 in comparison in that a power control section 120b is included as constituent instead of power control section 120a. Power control section 120b is different from the power control section 120a shown in FIG. 2 in comparison that threshold voltage generating circuit 121 and comparator 122 is omitted. In power control section 120b, control section 8 performs issuance of an on/off command of control state changeover switches 124 and 125, that is, a changeover command between open loop control and closed loop control. Control section 8 issues an on/off command for control state changeover switches 124 and 125 according to transmission power designated value $P_{CMD}$.

Figure 6:
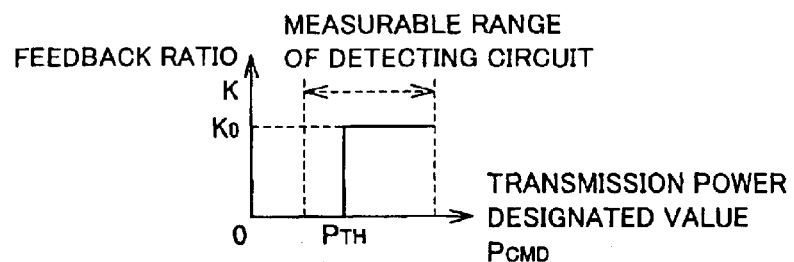
FIG. 6 is a conceptual graph for describing setting of a detection voltage feedback ratio by a power control section shown in FIG. 5.

Referring to FIG. 6, power control section 120b, when transmission power designated value $P_{CMD}$ is larger than a prescribed level $P_{TH}$, determines that transmission power $P_{OUT}$ is within a measurable range of detecting circuit 3 to set detection voltage feedback ratio K to $K_0$. In this case, control state changeover switch 124 is turned on and control state changeover switch 125 is turned off, in response to a command of control section 8.

On the other hand, power control section 120b, when transmission power designated value $P_{CMD}$ is lower than a prescribed level $P_{TH}$, determines that transmission power $P_{OUT}$ is out of a measurable range of detecting circuit 3 to set detection voltage feedback ratio K to 0. In this case, control state changeover switch 125 is turned on and control state changeover switch 124 is turned off, in response to a command of control section 8.

That is, in the first modification of the first embodiment, a determination on whether or not actual transmission power $P_{OUT}$ is within a measurable range of detecting circuit 3 is executed based not on actual detection voltage $V_{DET}$ but on transmission power designated value $P_{CMD}$. Since the other part and operations therein of transmission power control circuit 101b are similar to transmission power control circuit 101a shown FIG. 2, none of descriptions thereof is repeated.

With such an architecture adopted, while a precision in determining whether or not actual transmission power $P_{OUT}$ is within a measurable range of detecting circuit 3 is lowered, a circuit determining a level of detection voltage $V_{DET}$, that is, threshold voltage generating circuit 121 and comparator 122 can be deleted, thereby enabling simplification of an architecture of power control section 120b.

Second Modification of the First Embodiment

Figure 7:
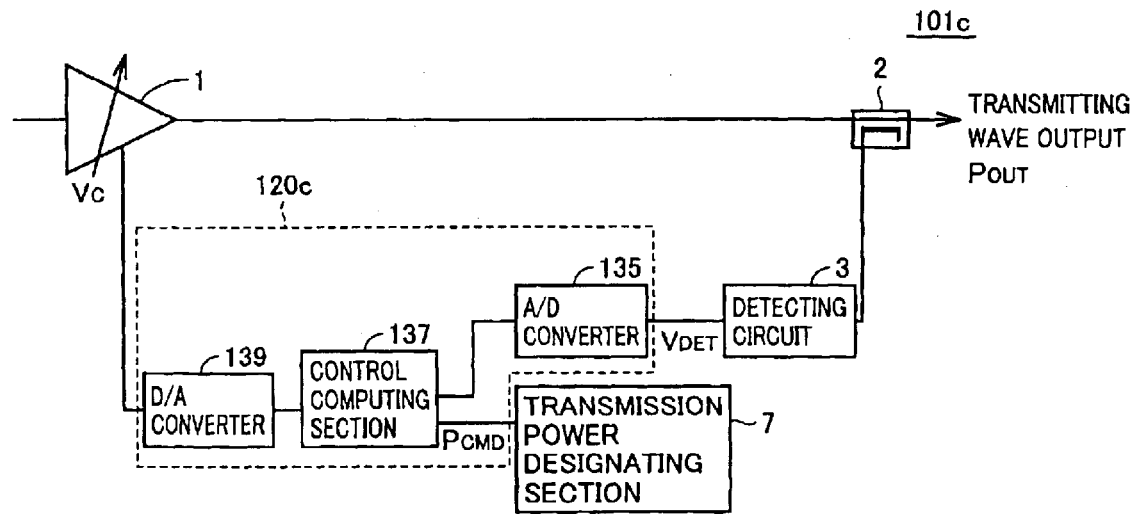
FIG. 7 is a block diagram showing an architecture of a transmission power control circuit according a second modification of the first embodiment of the present invention.

Referring to FIG. 7, a transmission power control circuit 101c according to a second modification of the first embodiment is different from the transmission power control circuit 101a shown in FIG. 2 in comparison in that power control section 120c is included instead of power control section 120a. Furthermore, control section 8 and D/A converter 9 are not included and transmission power designated value $P_{CMD}$ from transmission power designating section 7 is given directly to power control section 120c as a digital signal as is.

Power control section 120c includes an A/D converter 135; a control computing section 137; and a D/A converter 139.

A/D converter 135 converts detection voltage $V_{DET}$ form detecting circuit 3 to a digital signal. Control computing section 137 receives a digital signal according to detection voltage $V_{DET}$ form detecting circuit 3 and transmission power designated value $P_{CMD}$ as a digital signal unchanged to perform a digital computing based on detection voltage feedback ratio K set similarly to FIG. 6. That is, control computing section 137 performs a control operation similar to power control section 110b constructed as an analog circuit. A result of the operation in control computing section 137 is converted to an analog voltage by D/A converter 139 and transmitted to variable gain amplifier 1 as control voltage $V_C$.

In such a way, in the second modification of the first embodiment, transmission power control similar to the first modification of the first embodiment can be realized by a digital computing.

Note that, while in the first embodiment and the first and second modifications thereof as well, the architectures are shown in which a design is performed so that a measurable range of detecting circuit 3 corresponds to a relative high range of transmission power $P_{OUT}$, an architecture can be adopted in which a measurable range of detecting circuit 3 corresponds to a relative small range of transmission power $P_{OUT}$ and a correspondence between large/small of transmission power $P_{OUT}$ and setting of open loop control/close loop control is reversed.

Second Embodiment

In a transmission power control circuit according to the first embodiment, changeover is made between open loop control and close loop control according a result of determination on whether or not actual transmission power $P_{OUT}$ is inside a measurable range of a detecting circuit. As a result of this, since a detection voltage feedback ratio changes stepwise in the vicinity of a changeover boundary region between open loop control and close loop control, there is a risk of a sudden change in transmission power $P_{OUT}$ in the vicinity. Therefore, in the second embodiment, description will be given of a control scheme preventing a sudden change in a transmission power in a changeover boundary region between open loop control and close loop control.

Figure 8:
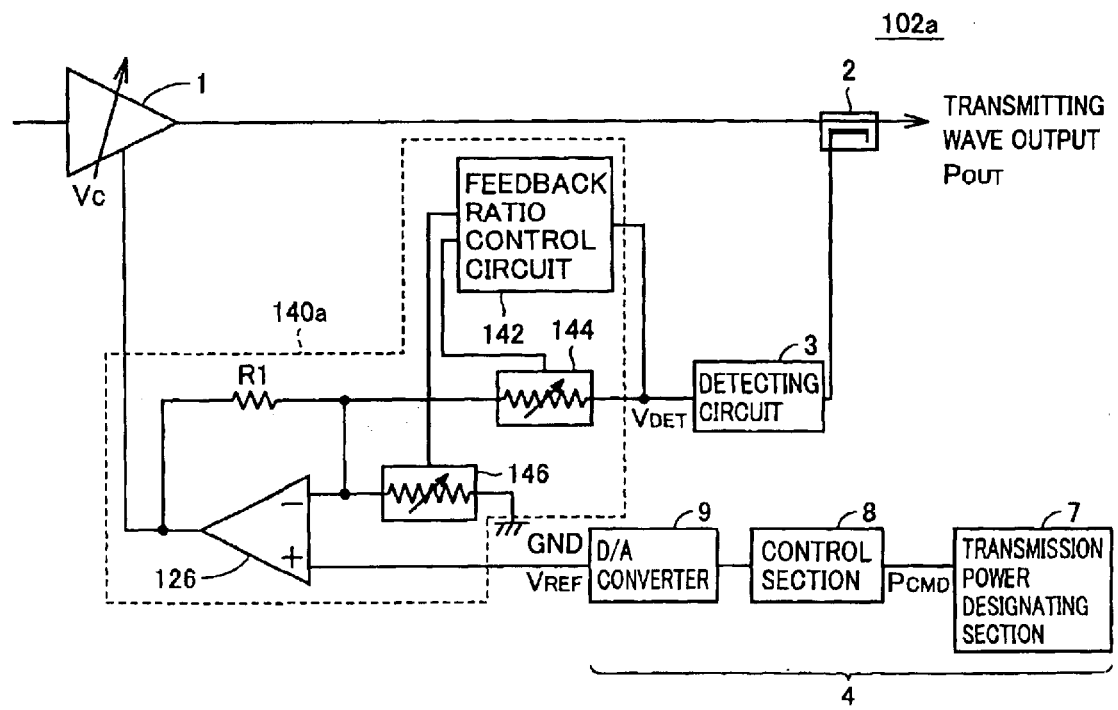
FIG. 8 is a block diagram showing an architecture of a transmission power control circuit according to a second embodiment of the present invention.

Referring to FIG. 8, a transmission power control circuit 102a according to the second embodiment is different from transmission power control circuit 101a according to the first embodiment shown in FIG. 2 in comparison in that power control section 140a is included as constituent instead of power control section 120a.

Power control section 140a is different from power control section 120a shown in FIG. 2 in comparison in that feedback control circuit 142 is incorporated instead of threshold voltage generating circuit 121 and comparator 122; a variable resistor 144 instead of control state changeover switch 124 and resistance element R2; and a variable resistor 146 instead of control state changeover switch 125 and resistance element R3.

Feedback ratio control circuit 142 controls resistance values of variable resistors 144 and 146 according to detection voltage $V_{DET}$ from detecting circuit 3. Variable resistor 144 is used as means adjusting detection voltage feedback ratio K. Variable resistor 146 is used as means adjusting control voltage feedback ratio K'.

Figure 9:
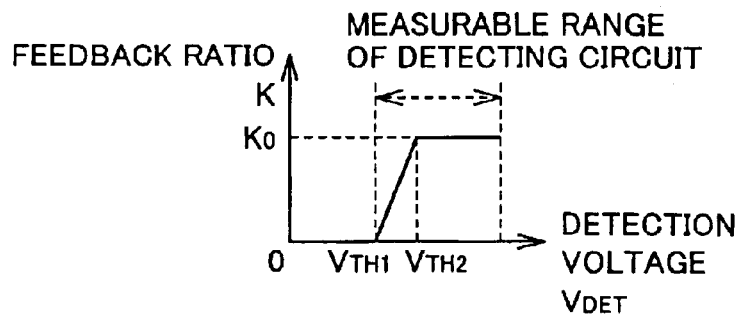
FIG. 9 is a conceptual graph for describing setting of a detection voltage feedback ratio by a power control section shown in FIG. 8.

Referring to FIG. 9, when detection voltage $V_{DET}$ is larger than a prescribed voltage $V_{TH2}$, that is when it is determined that transmission power $P_{OUT}$ is sufficiently within a measurable range of detecting circuit 3, feedback ratio control circuit 142 sets a resistance value of variable resistor 146 to the maximum ($\infty$, ideally). Thereby, detection voltage feedback ratio K is set to $K_0$ based on a ratio between resistance element R2 and a resistance value of variable resistor 146 to perform close loop control by negative-feedback of detection voltage $V_{DET}$.

On the other hand, when detection voltage $V_{DET}$ is smaller than a prescribed voltage $V_{TH1}$, that is when it is determined that transmission power $P_{OUT}$ is outside a measurable range of detecting circuit 3, feedback ratio control circuit 142 sets a resistance value of variable resistor 144 to the maximum ($\infty$, ideally). As a result, a non-inverting amplifier with reference voltage $V_{REF}$ as an input is constituted by control voltage feedback ratio K' according to resistance element R1 and a resistance value of variable resistor 144 to thereby perform open loop control of transmission power $P_{OUT}$ based on transmission power designated value $P_{CMD}$.

Furthermore, in a region, corresponding to a changeover boundary region between open loop control and close loop control, and in which detection voltage $V_{DET}$ is higher than prescribed voltage $V_{TH1}$ and lower than $V_{TH2}$, feedback ratio control circuit 142 adjusts resistance values of variable resistors 144 and 146 so that detection voltage feedback ratio K gradually changes. In this region, detection voltage feedback ratio K is set so that transmission power $P_{OUT}$ decreases toward outside a measurable range of detecting circuit.

Figure 10:
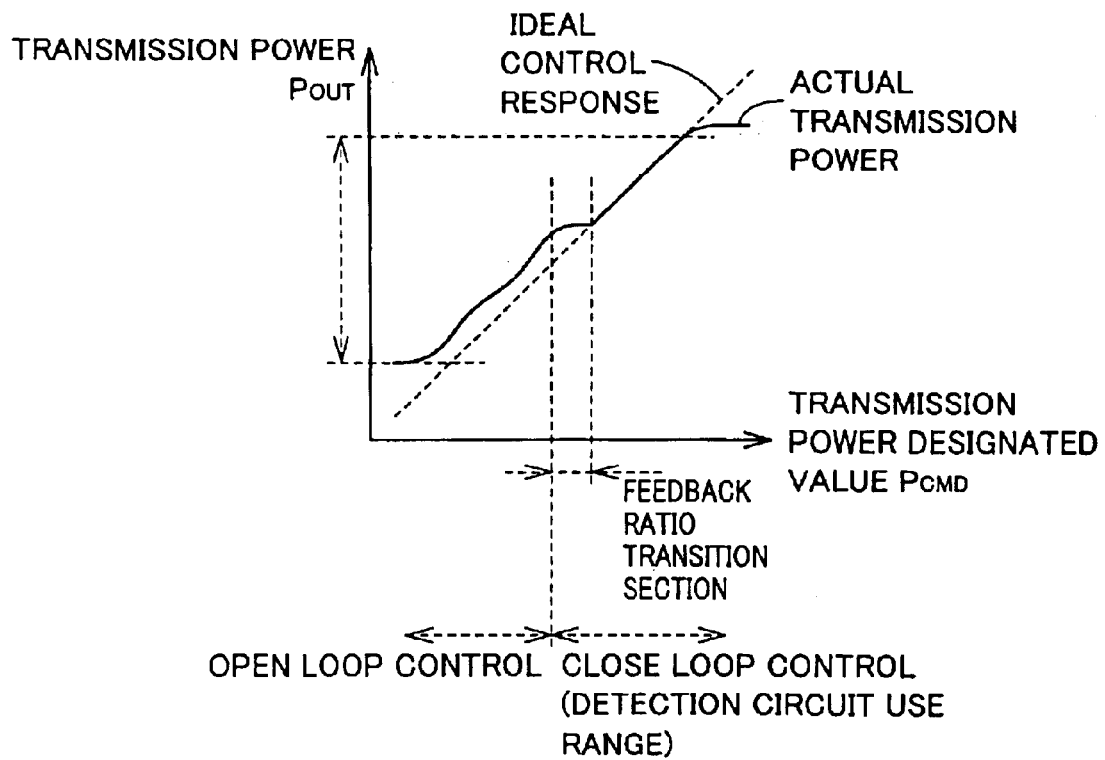
FIG. 10 is a conceptual graph showing a transmission power control characteristic according to the second embodiment.

In comparison of FIG. 10 with FIG. 4, in an architecture according to the second embodiment, there is provided a feedback ratio transition section where detection voltage feedback ratio K gradually changes in a changeover boundary region between open loop control and close loop control to change over between close loop control and open loop; therefore, a sudden change in transmission power can be prevented in the changeover boundary region.

First Modification of Second Embodiment

Figure 11:
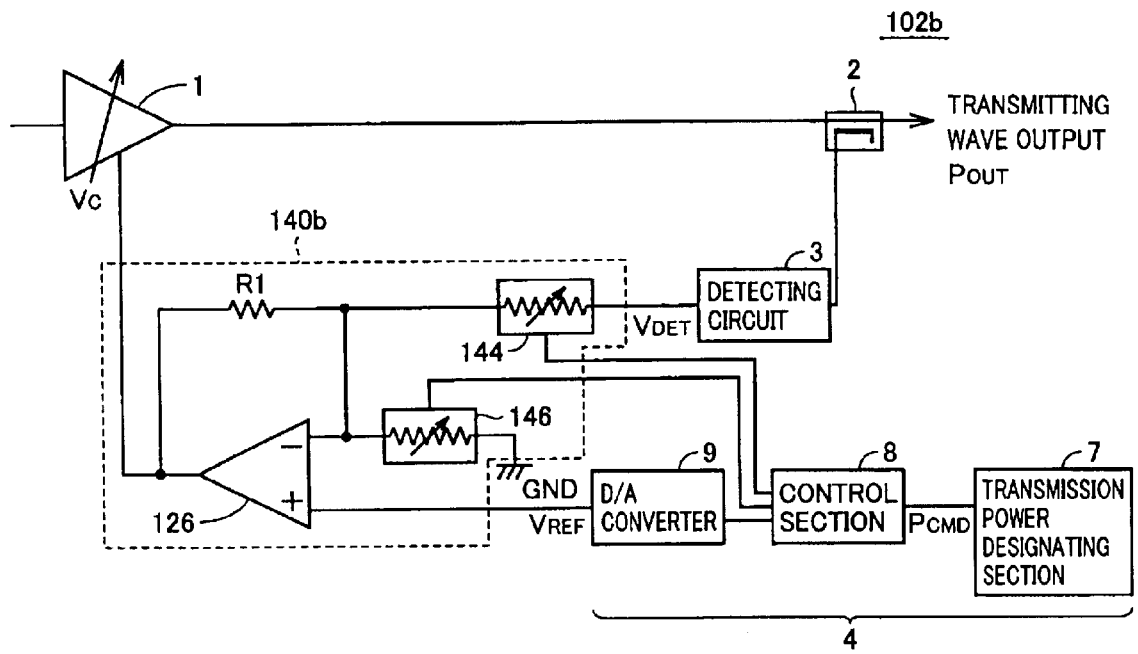
FIG. 11 is a block diagram showing an architecture of a transmission power control circuit according to a first modification of the second embodiment.

Referring to FIG. 11, a transmission power control circuit 102b according to a first modification of the second embodiment is different from transmission power control circuit 102a shown in FIG. 8 in comparison in that power control section 140b is included instead of power control section 140a.

Power control section 140b is different from power control section 140a shown in FIG. 8 in that feedback ratio control circuit 142 is omitted. In power control section 140b, resistance values of variable resistors 144 and 146 are controlled by control section 8. Control section 8 sets resistance values of variable resistors 144 and 146 according to transmission power designated value $P_{CMD}$ from transmission power designating section 7.

Figure 12:
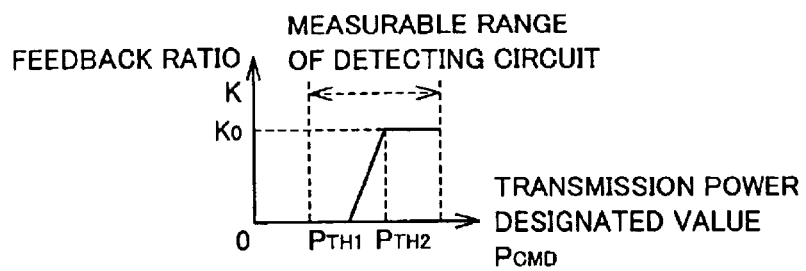
FIG. 12 is a conceptual graph for describing setting of a detection voltage feedback ratio by a power control section shown in FIG. 11.

Referring to FIG. 12, when transmission power designated value $P_{CMD}$ is larger than prescribed level $P_{TH2}$, that is when it is determined that transmission power $P_{OUT}$ is sufficiently inside a measurable range of detecting circuit 3, control section 8 sets a resistance value of variable resistor 146 to the maximum ($\infty$, ideally). Thereby, detection voltage feedback ratio K is set to $K_0$ based on a ratio between resistance element R2 and a resistance value of variable resistor 144 to perform close loop control by negative-feedback of detection voltage $V_{DET}$.

On the other hand, when transmission power designated value $P_{CMD}$ is smaller than prescribed level $P_{TH1}$, that is when it is determined that transmission power $P_{OUT}$ is outside a measurable range of detecting circuit 3, control section 8 set a resistance value of variable resistor 144 to the maximum ($\infty$, ideally). As a result, a non-inverting amplifier with reference voltage $V_{REF}$ as an input is constituted by control voltage feedback ratio K' according to resistance element R1 and a resistance value of variable resistor 146 to thereby perform open loop control of transmission power $P_{OUT}$ based on transmission power designated value $P_{CMD}$.

Furthermore, when transmission power designated value $P_{CMD}$ corresponding to a changeover boundary region between open loop control and close loop control is higher than prescribed level $P_{TH1}$ and lower than prescribed level $P_{TH2}$, control section 8 adjusts resistance values of variable resistors 144 and 146 so that detection voltage feedback ratio K gradually changes. Detection voltage feedback ratio K is set similar to the second embodiment so that transmission power $P_{OUT}$ decreases toward outside a measurable range of detecting circuit in a changeover boundary region.

In such away, in transmission power control circuit 102b according to the first modification of the second embodiment, whether actual transmission power $P_{OUT}$ is inside or outside a measurable range of detecting circuit 3 is determined not by detection voltage $V_{DET}$ but by transmission power designated value $P_{CMD}$. With such a architecture adopted, while a precision in determining whether or not actual transmission power $P_{OUT}$ is inside or outside a measurable range of detecting circuit 3 is lowered, a circuit (feedback ratio control circuit 142 in FIG. 8) performing determination based on detection voltage $V_{DET}$ is not required any longer in the system; thereby enabling simple architecture of a power control section to be realized.

While in the second embodiment and the first modification thereof, the architecture is shown in which detection voltage feedback ratio K continuously changes in an changeover boundary region between open loop control and close loop control and an architecture is shown in which variable resistors 144 and 146 each of whose resistance value changes in an analog fashion. As variable resistors, a type whose resistance value gradually changes stepwise may also used. In this case, detection voltage feedback ratio K in a changeover boundary region gradually changes stepwise.

Second Modification of Second Embodiment

Figure 13:
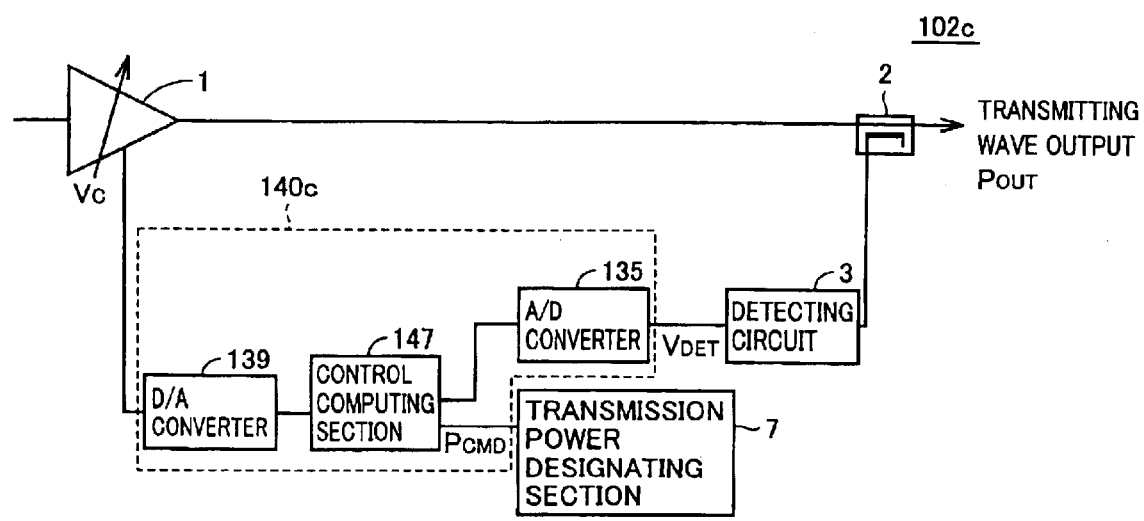
FIG. 13 is a block diagram showing an architecture of a transmission power control circuit according a second modification of the second embodiment of the present invention.

Referring to FIG. 13, transmission power control circuit 102c according to the second modification of the second embodiment is different from transmission power control circuit 102a shown in FIG. 8 in comparison in that power control section 140c is incorporated instead of power control section 140a. Furthermore, control section 8 and D/A converter 9 are omitted and transmission power designating value $P_{CMD}$ from transmission power designating section 7 is given directly to power control section 140c as a digital signal as is.

Power control section 140c includes: an A/D converter 135; a control computing section 147; and a D/A converter 139.

Operation in A/D converter 135 is similar to operation described in FIG. 7. Control computing section 147 receives a digital signal corresponding to detection voltage $V_{DET}$ from detecting circuit 3 and transmission power designated value $P_{CMD}$ as a digital signal unchanged to perform a digital computing based on detection voltage feedback ratio K set similarly to FIG. 12. That is, in control computing section 137, a control operation similar to power control section 140b as an analog circuit. A result of the operation of control computing section 137 is converted to an analog signal by D/A converter 139 and transmitted to variable gain amplifier 1 as control voltage $V_C$.

In such a way, in the second modification of the second embodiment, there can be realized transmission power control similar to the first modification of the second embodiment by a digital computing.

In the second embodiment and first and second modifications thereof as well, the architectures are shown that is designed so that a measurable range of detecting circuit 3 corresponds to a relative high range of transmission power $P_{OUT}$, an architecture can be adopted in which a measurable range of detecting circuit 3 corresponds to a relative small range of transmission power $P_{OUT}$ and a correspondence between large/small of transmission power $P_{OUT}$ and setting of open loop control/close loop control is reversed.

Third Embodiment

Figure 14:
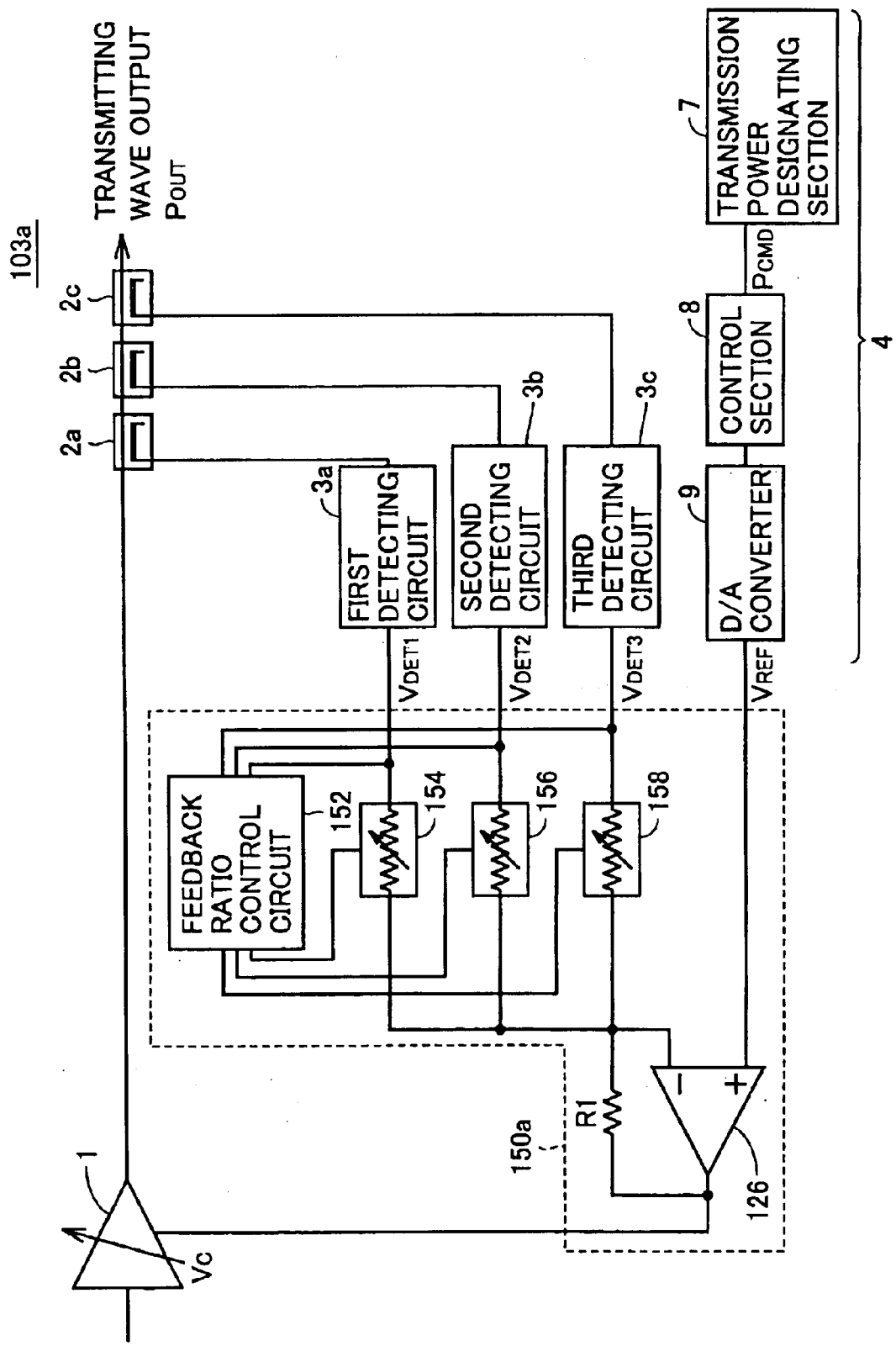
FIG. 14 is a block diagram showing an architecture of a transmission power control circuit according to a third embodiment of the present invention.

Referring to FIG. 14, transmission power control circuit 103a according to the third embodiment is different from transmission power control circuit 101a according to the first embodiment shown in FIG. 2 in comparison in that there are a plurality of incorporated distributors 2a, 2b and 2c, a first detecting circuit 3a, a second detecting circuit 3b and a third detecting circuit 3c, having respective different measurable ranges. First detecting circuit 3a, second detecting circuit 3b and third detecting circuit 3c are provided corresponding to distributors 2a, 2b ad 2c, respectively.

First detecting circuit 3a generates detection voltage $V_{DET1}$ by detecting part of transmission power obtained by distributor 2a. Second detecting circuit 3b generates detection voltage $V_{DET2}$ by detecting part of transmission power obtained by distributor 2b. Third detecting circuit 3c generates detection voltage $V_{DET3}$ by detecting part of transmission power obtained by distributor 2c.

Transmission power control circuit 103a according to the third embodiment is different from transmission power control circuit 101a shown in FIG. 2 in comparison in that power control section 150a is incorporated instead of power control section 120a.

Power control section 150a includes: a feedback ratio control circuit 152; variable resistors 154, 156 and 158; resistance element R2; and an operational amplifier 126.

Variable resistor 154 is disposed between first detecting circuit 3a and the non-inverting input terminal of operational amplifier 126 to transmit detection voltage $V_{DET1}$. Variable resistor 156 is disposed between second detecting circuit 3b and the non-inverting input terminal of operational amplifier 126 to transmit detection voltage $V_{DET2}$. Variable resistor 158 is disposed between third detecting circuit 3c and the non-inverting input terminal of operational amplifier 126 to transmit detection voltage $V_{DET3}$.

Feedback ratio control circuit 152 sets resistance values of variable resistor 154, 156 and 158 based on detection voltages $V_{DET1}$, $V_{DET2}$ and $V_{DET3}$.

Figure 15A:
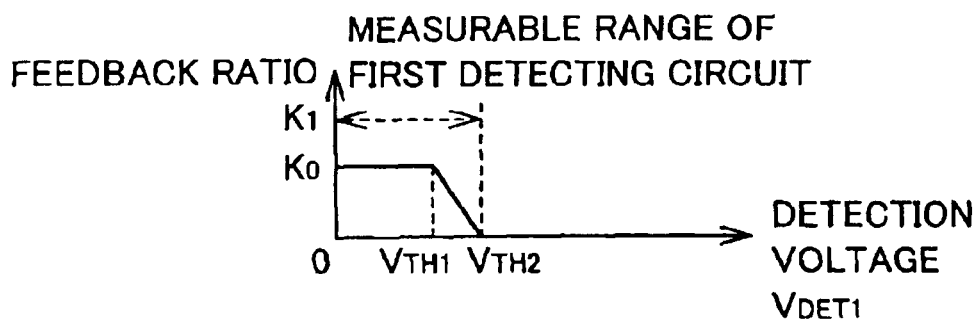
FIGS. 15A to 15C are conceptual graphs for describing setting of a detection voltage feedback ratio by a power control section shown in FIG. 14.
Figure 15B:
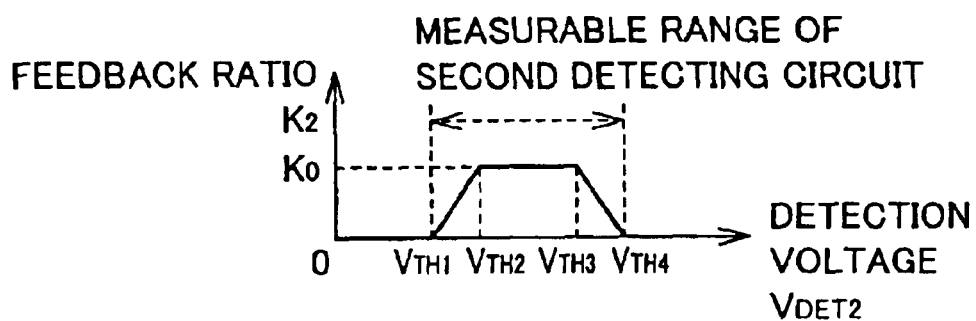
Figure 15C:
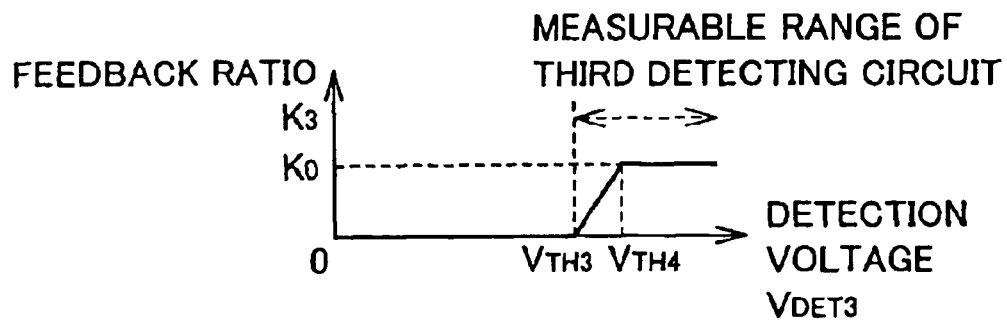

Referring to FIGS. 15A to 15C, while first detecting circuit 3a, second detecting circuit 3b and third detecting circuit 3c have respective different measurable ranges, measurable ranges between any two detecting circuits adjacent to each other are set so as to overlap on each other. For example, a measurable range of first detecting circuit 3a corresponds to a range of $V_{DET1}<V_{TH2}$ and a measurable range of second detecting circuit 3b corresponds to a range of $V_{TH1}<V_{DET2}<V_{TH4}$. Furthermore, a measurable range of third detecting circuit 3c corresponds to a range of $V_{DET3}>V_{TH3}$. Established between threshold voltages are relations that $V_{TH1}<V_{TH2}$ and $V_{TH4}>V_{TH3}$.

Therefore, in a range in which detection voltage is higher than $V_{TH1}$ and lower than $V_{TH2}$, measurement can be performed in both of first detecting circuit 3a and second detecting circuit 3b. Similarly, in a range in which detection voltage is higher than $V_{TH3}$ and lower than $V_{TH4}$, measurement can be performed in both of second detecting circuit 3b and third detecting circuit 3c Feedback ratio control circuit 152 sets resistance values of variable resistors 154, 156 and 158 so that detection voltage feedback ratios $K_1$, $K_2$ and $K_3$ corresponding to respective detection voltages $V_{DET1}$, $V_{DET2}$ and $V_{DET3}$ change as shown in FIGS. 14A to 14C according to a detection voltage.

Referring to FIG. 15A, when detection voltage $V_{DET1}$ corresponds to a measurable range of first detecting circuit 3a, that is when $V_{DET1}<V_{TH2}$ feedback ratio $K_1$ corresponding to detection voltage $V_{DET1}$ is set to $K_1>0$. Especially, when overlapping occurs on a measurable range of second detecting circuit 3b, that is in a range of $V_{TH1}<V_{DET1}<V_{TH2}$, detection voltage feedback ratio $K_1$ changes so as to gradually decrease toward a non-measurable range of first detecting circuit 3a, that is as $V_{DET1}$ approaches $V_{TH2}$. On the other hand, in the other range, that is in a range of $V_{TH1}<V_{DET1}$, detection voltage feedback ratio $K_1$ is set to prescribed level $K_0$.

On the other hand, when detection voltage $V_{DET1}$ corresponds to outside a measurable range of first detecting circuit 3a ($V_{DET1}>V_{TH2}$,), detection voltage feedback ratio $K_1$ is set to 0. In this case, a resistance value of variable resistor 154 is set to the maximum value ($\infty$, ideally).

Referring to FIG. 15B, feedback ratio $K_2$ corresponding to detection voltage $V_{DET2}$ is set to $K_2>0$ when detection voltage $V_{DET2}$ corresponds to a measurable range of second detecting circuit 3b, that is in a case of $V_{TH1}<V_{DET2}<V_{TH4}$. Especially, in a range where overlapping occurs on a measurable range of first detecting circuit 3a or second detecting circuit 3b, that is $V_{TH1}<V_{DET2}<V_{TH2}$ and $V_{TH3}<V_{DET2}<V_{TH4}$, detection voltage feedback ratio $K_2$ changes so as to gradually decrease toward a non-measurable range of second detecting circuit 3b. On the other hand, in the other range, that is in a range of $V_{TH1}<V_{TH2}$, detection voltage feedback ratio $K_1$ is set to prescribed level $K_0$. Furthermore, still in the other range, that is in a range of $V_{TH2}<V_{DET2}<V_{TH3}$, detection voltage feedback ratio $K_2$ is set to prescribed level $K_0$.

In contrast, when detection voltage $V_{DET2}$ corresponds to outside a measurable range of first detecting circuit 3b ($V_{DET2}<V_{TH1}$ or $V_{DET2}>V_{TH4}$), detection voltage feedback ratio $K_2$ is set to 0. A resistance value of variable resistor 156 is set the maximum value ($\infty$, ideally).

Referring to FIG. 15C, feedback ratio $K_3$ corresponding detection voltage $V_{DET3}$ is set to $K_3>0$, when detection voltage $V_{DET3}$ corresponds to a measurable range of third detecting circuit 3c, that is in a case of $V_{DET3}>V_{TH3}$. Especially, in a range which overlaps a measurable range of second detecting circuit 3b, that is in a range of $V_{TH}<V_{DET3}<V_{TH4}$, detection voltage feedback ratio $K_3$ changes so as to gradually decrease toward a non-measurable range of third detecting circuit 3c, that is as $V_{DET3}$ comes to closer to $V_{TH3}$. On the other hand, in the other range, that is in a range of $V_{DET3}>V_{TH4}$, detection voltage feedback ratio $K_3$ is set to prescribed level $K_0$.

In contrast, when detection voltage $V_{DET3}$ corresponds to outside a measurable range of third detecting circuit 3c ($V_{DET3}<V_{TH3}$), detection voltage feedback ratio $K_3$ is set to 0. A resistance value of variable resistor 158 is set to the maximum value ($\infty$, ideally).

With such an architecture adopted, in a range where measurable ranges of first detecting circuit 3a, second detecting circuit 3b and third detecting circuit 3c overlap each other, that is in the vicinity of changeover between mainly used detection circuits, detection voltage feedback ratios $K_1$ to $K_3$ are set so that detection voltages from two detecting circuits sharing the overlapped measurable ranges with each other are synthesized and negative-fed back.

Furthermore, in such a range, detection voltage feedback ratios $K_1$ to $K_3$ are set so that a synthetic ratio between synthesized detection voltages gradually changes according to a relationship between a detection voltage and a measurable range of a detecting circuit.

Therefore, close loop control with a detection voltage for ensuring a wide dynamic range of a transmission power can be implemented without increasing measurable ranges of respective detecting circuits, that is by use of a plurality of general inexpensive detecting circuits. Furthermore, a discontinuous change in transmission power can be prevented in changeover between mainly used detecting circuits according to a relationship between a measurable range of each detecting circuit and a detection voltage.

First Modification of Third Embodiment

Figure 16:
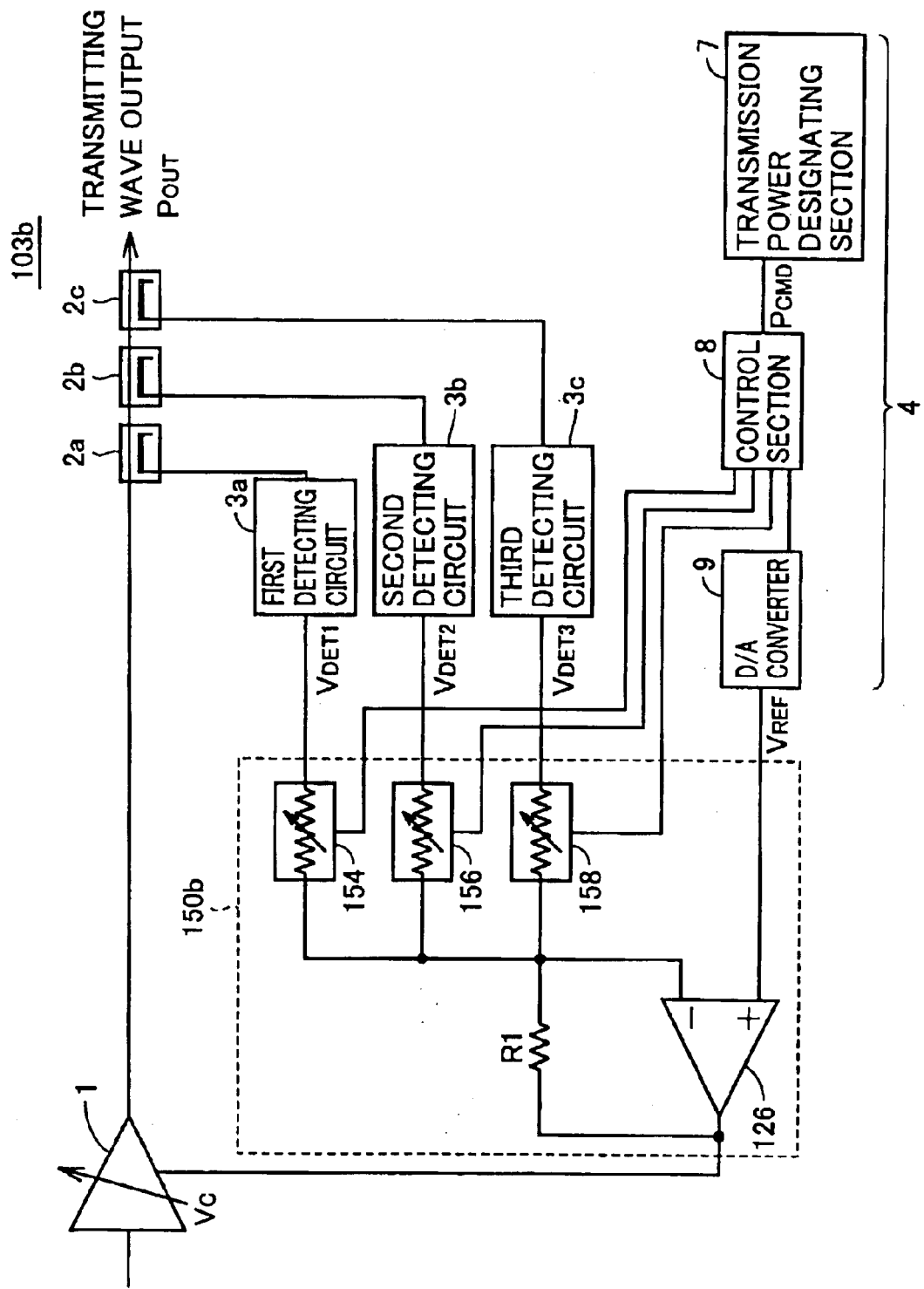
FIG. 16 is a block diagram showing an architecture of a transmission power control circuit according a first modification of the third embodiment.

Referring to FIG. 16, transmission power control circuit 103b according to a first modification of the third embodiment is different from transmission power control circuit 103a according to of the third embodiment in comparison in that a power control section 150b is included instead of power control section 150a.

Power control section 150b is different from power control section 150a shown in FIG. 14 in that feedback ratio control circuit 152 is omitted in architecture. In power control section 150b, resistance values of variable resistors 154, 156 and 158 are controlled by control section 8. Control section 8 sets resistance values of variable resistors 154, 156 and 158 according to transmission power designated value $P_{CMD}$ from transmission power designating section 7 so that detection voltage feedback ratios $K_1$, $K_2$ and $K_3$ change according to a detection voltage as shown in FIGS. 17A to 17C.

Figure 17A:
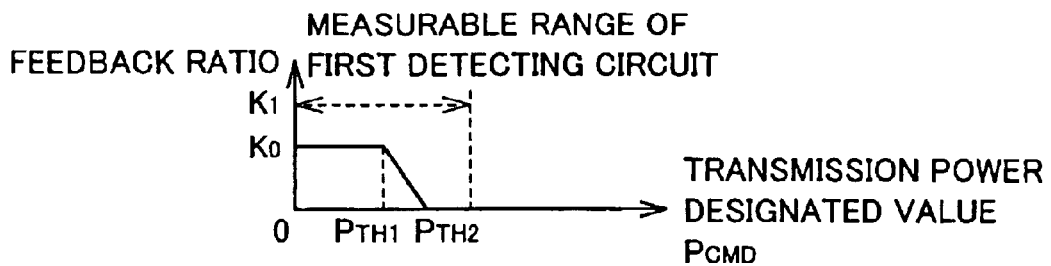
FIGS. 17A to 17C are conceptual graphs for describing setting of a detection voltage feedback ratio by a power control section shown in FIG. 16.
Figure 17B:
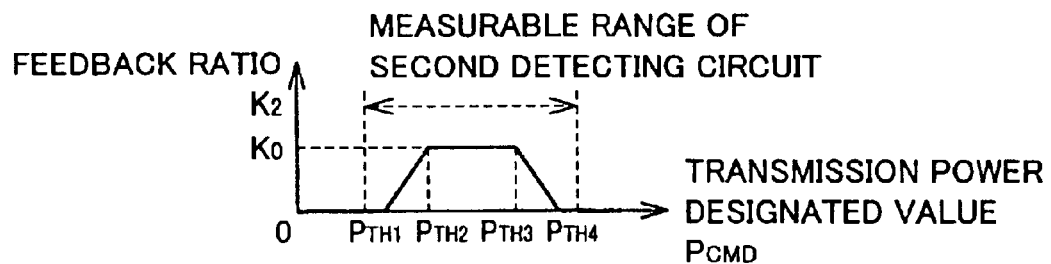
Figure 17C:
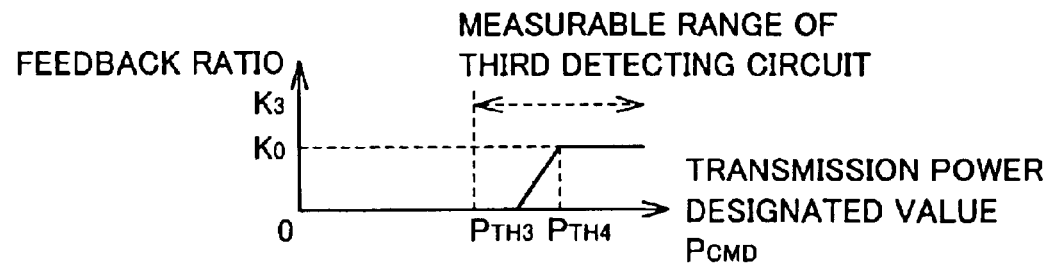

Referring to FIGS. 17A to 17C, threshold voltages $P_{TH1}$, $P_{TH2}$, $P_{TH3}$ and $P_{TH4}$ are determined correspondingly to measurable ranges of first detecting circuit 3a, second detecting circuit 3b and third detecting circuit 3c, respectively.

Referring to FIG. 17A, feedback ratio $K_1$ corresponding to detection voltage $V_{DET1}$ is set to $K_1>0$ when it is determined that transmission power designated value $P_{CMD}$ corresponds to a measurable range of fist detecting circuit 3a, that is in a case of $P_{CMD}<P_{TH2}$. Especially, in a range in which overlapping occurs on a measurable range of second detecting circuit 3b, that is in a range of $P_{TH1}<P_{CMD}<P_{TH2}$, detection voltage feedback ratio $K_1$ changes so as to gradually decrease toward a non-measurable range of first detecting circuit 3a, that is as $P_{CMD}$ approaches $P_{TH2}$. On the other hand, in the other range, that is in a range of $P_{CMD}<P_{TH1}$, detection voltage feedback ratio $K_1$ is set to prescribed level $K_0$.

In contrast to this, when it is determined that transmission power designated value $P_{CMD}$ corresponds to outside a measurable range of first detecting circuit 3a ($P_{CMD}>P_{TH2}$), detection voltage feedback ratio $K_1$ is set to 0.

Referring to FIG. 17B, feedback ratio $K_2$ corresponding to detection voltage $V_{DET2}$ is set to $K_2>0$, when it is determined that transmission power designated value $P_{CMD}$ corresponds to a measurable range of second detecting circuit 3b, that is, in a case of $P_{TH1}<P_{CMD}<P_{TH4}$. Especially, in a range in which overlapping occurs on a measurable range of first detecting circuit 3a or third detecting circuit 3c, that is in a range of $P_{TH1}<P_{CMD}<P_{TH2}$ and in a range of $P_{TH3}<P_{CMD}<P_{TH4}$, detection voltage feedback ratio $K_2$ changes so as to gradually decrease toward a non-measurable range of second detecting circuit 3b. On the other hand, in the other range, that is in a range of $P_{TH2}<P_{CMD}<P_{TH3}$, detection voltage feedback ratio $K_2$ is set to prescribed level $K_0$.

In contrast to this, when it is determined that transmission power designated value $P_{CMD}$ corresponds to outside a measurable range of first detecting circuit 3b ($P_{CMD}<P_{TH1}$ or $P_{CMD}>P_{TH4}$), detection voltage feedback ratio $K_2$ is set to prescribed level 0.

Referring to FIG. 17C, feedback ratio $K_3$ corresponding to detection voltage $V_{DET3}$ is set to $K_3>0$, when it is determined that transmission power designated value $P_{CMD}$ corresponds to a measurable range of third detecting circuit 3c, that is, in a case of $P_{CMD}>P_{TH3}$. Especially, in a range in which overlapping occurs on a measurable range of second detecting circuit 3b, that is in a range of $P_{TH3}<P_{CMD}<P_{TH4}$, detection voltage feedback ratio $K_3$ changes so as to gradually decrease toward a non-measurable range of third detecting circuit 3c, that is as $P_{CMD}$ approaches $P_{TH3}$. On the other hand, in the other range, that is in a range of $P_{CMD}>P_{TH4}$, detection voltage feedback ratio $K_3$ is set to prescribed level $K_0$.

In contrast to this, when it is determined that transmission power designated value $P_{CMD}$ corresponds to outside a measurable range of third detecting circuit 3c ($P_{CMD}<P_{TH3}$), detection voltage feedback ratio $K_3$ is set to 0.

In such a way, in transmission power control circuit 103b according to the first modification of the second embodiment, it is determined which is a detection circuit corresponding to actual transmission power $P_{OUT}$ according to transmission power designating value $P_{CMD}$. With such an architecture adopted, while determination precision in a detecting circuit having a measurable range corresponding to actual transmission power $P_{OUT}$ is lowered, no necessity arises for a circuit as a constituent (feedback ratio control circuit 152 in FIG. 14) performing a determination based on detection voltages $V_{DET1}$, $V_{DET2}$ and $V_{DET3}$, thereby enabling a simplified circuit architecture for performing transmission power control similar to the second embodiment.

Furthermore, while in the third embodiment and the first modification thereof as well, the architectures are shown in which variable resistors 154, 156 and 158, respective resistance values changing in an analog fashion, the resistors each may be of a type having a resistance value that changes gradually stepwise.

Second Modification of Third Embodiment

Figure 18:
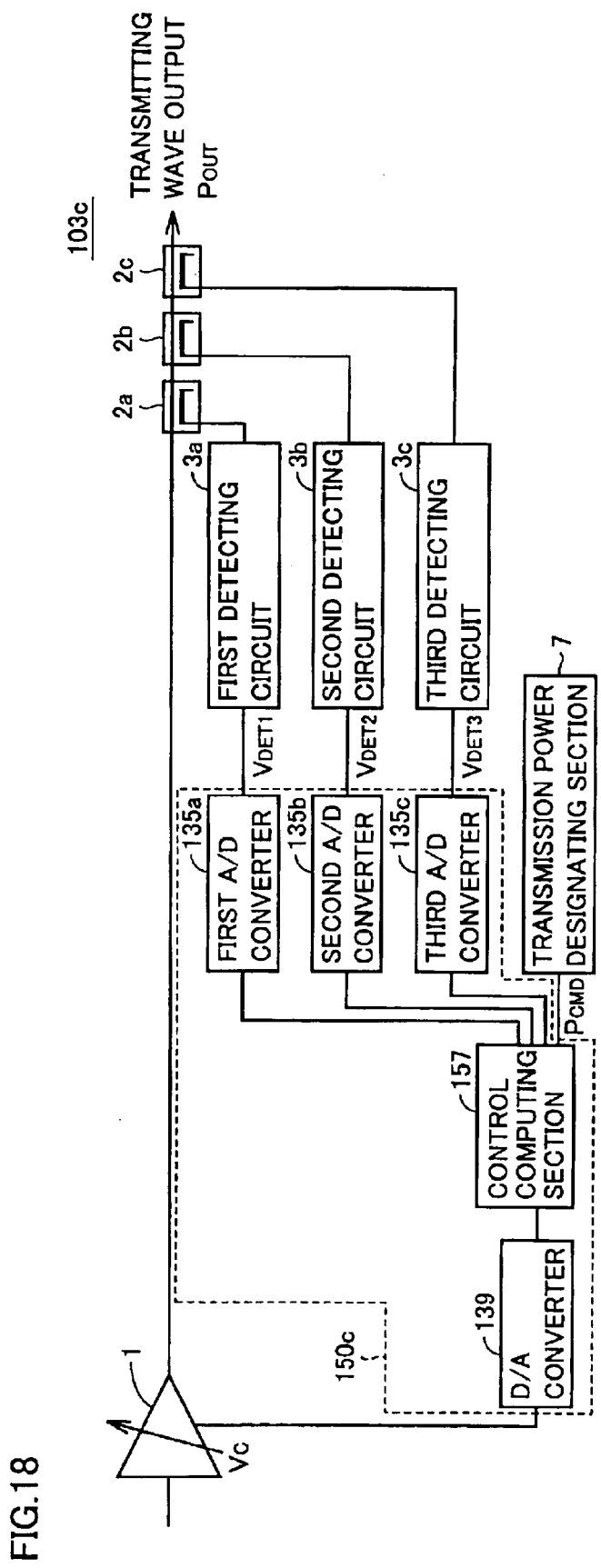
FIG. 18 is a block diagram showing an architecture of a transmission power control circuit according a second modification of the third embodiment of the present invention.

Referring to FIG. 18, transmission power control circuit 103c according to a second modification of the third embodiment is different from transmission power control circuit 103a according to the third embodiment in comparison in that power control section 150c is included as a constituent instead of power control section 150a. Furthermore, control section 8 and D/A converter 9 are omitted in the architecture and transmission power designated value $P_{CMD}$ from transmission designating section 7 is given directly to power control section 150c as a digital signal as is.

Power control section 150c has a first A/D converter 135a; a second A/D converter 135b; a third A/D converter 135c; a control computing section 157; and a D/A converter 139.

First AID converter 135a; second A/D converter 135b; and third A/D converter 135c are provided corresponding to first detecting circuit 3a, second detecting circuit 3b and third detecting circuit 3c, respectively and detection voltages $V_{DET1}$, $V_{DET2}$ and $V_{DET3}$ are converted to digital signals.

Control computing section 157 receives a plurality of digital signals corresponding to respective detection voltages $V_{DET1}$, $V_{DET2}$ and $V_{DET3}$ and transmission power designated value $P_{CMD}$ as a digital signal unchanged digital to perform a digital computing based on detection voltage feedback ratios $K_1$, $K_2$ and $K_3$, set similarly to FIGS. 17A to 17C. That is, in control computing section 157, there is performed a control operation similar to power control section 150b. A result of the operation in control computing section 157 is converted to an analog signal by D/A converter 139 and transmitted to variable gain amplifier 1 as control voltage $V_C$.

With such an architecture adopted, in the second modification of the third embodiment, detection voltages $V_{DET1}$, $V_{DET2}$ and $V_{DET3}$ are converted to respective digital signals and close loop control is realized based on a digital computing, thereby enabling realization of transmission power control similar to the first modification of the third embodiment.

Note that while in the third embodiment and the first and second modifications thereof, the architectures in which there are used the three detecting circuits having respective different measurable ranges, any plural number of such detection circuits can be used. In this case, a necessity rises for providing distributors and variable resistors correspondingly to respective detecting circuits.

Fourth Embodiment

In the fourth embodiment, description will be given of transmission power control obtained by combining an architecture in which a dynamic range covering a wide range of a transmission power using a plurality of detection circuits which is described in the third embodiment and an architecture in which changeover is made between close loop control and open loop control which is described in the first embodiment.

Figure 19:
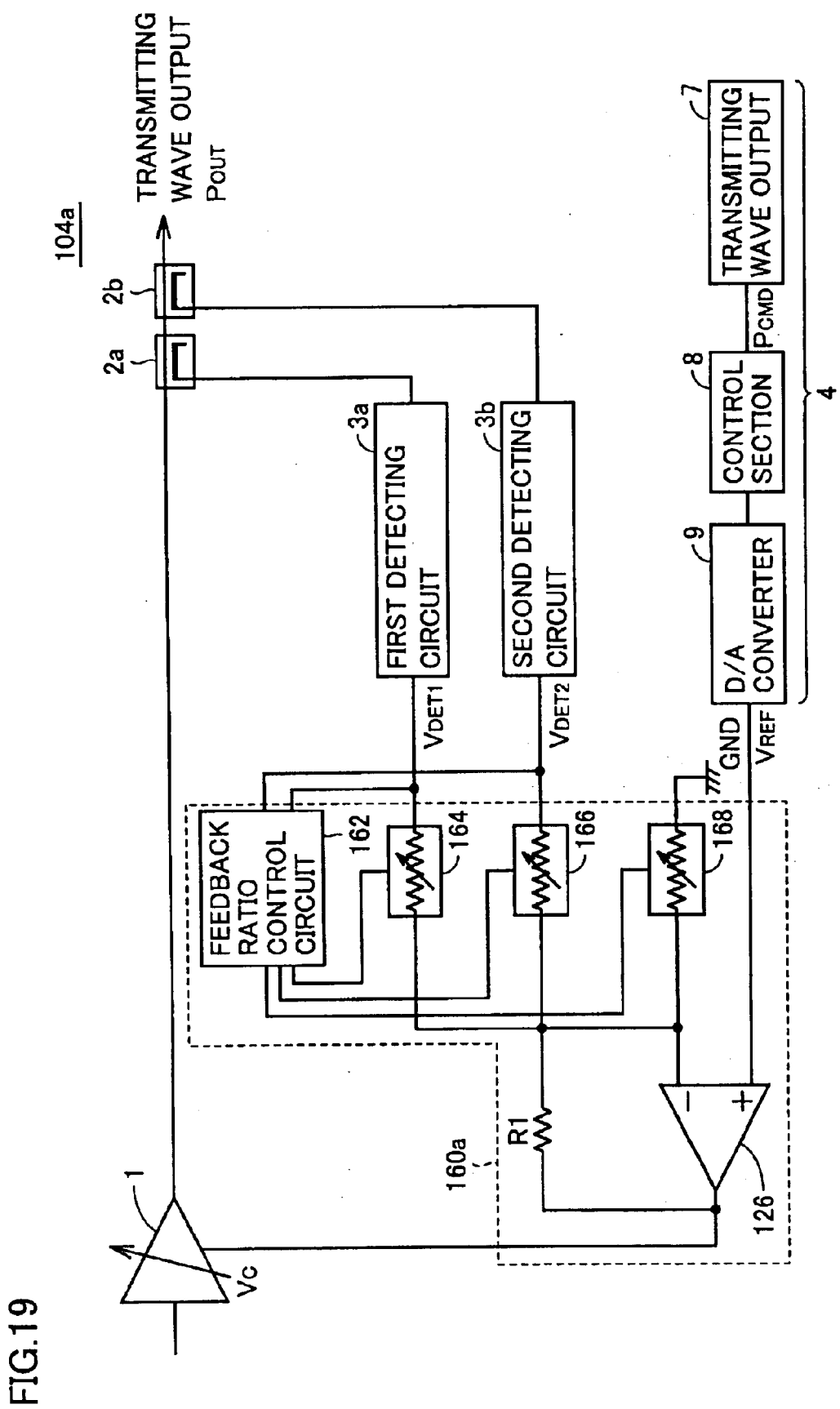
FIG. 19 is a block diagram showing an architecture of a transmission power control circuit according to a fourth embodiment of the present invention.

Referring to FIG. 19, transmission power control circuit 104a according to the fourth embodiment is different from transmission power control circuit 101a according to the first embodiment in comparison in that there is included first detecting circuit 3a and second detecting circuit 3b, both having respectively different measurable ranges, and distributors 2a and 2b corresponding to first detecting circuit 3a and second detecting circuit 3b.

Furthermore, transmission power control circuit 104a according to the fourth embodiment includes: power control section 160a instead of power control section 120a shown in FIG. 2.

Figure 20A:
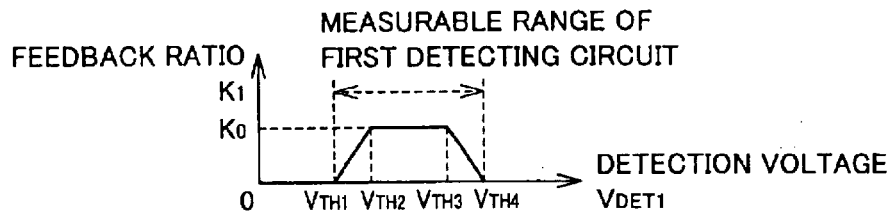
FIGS. 20A and 20B are conceptual graphs for describing setting of a detection voltage feedback ratio by a power control section shown in FIG. 19.
Figure 20B:
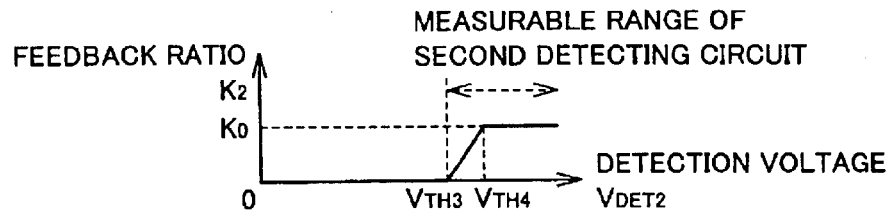

Referring to FIGS. 20A and 20B, a measurable range of first detecting circuit 3a corresponds to a range of $V_{TH1}<V_{DET1}<V_{TH4}$ of a detection voltage. On the other hand, a measurable range of second detecting circuit 3b corresponds to a range of $V_{DET2}>V_{TH3}$ of a detection voltage. Herein, measurable ranges of first detecting circuit 3a and second detecting circuit 3b are designed so as to be $V_{TH3}<V_{TH4}$, that is so that parts of measurable ranges are overlapped on each other.

Referring again to FIG. 19, power control section 160a includes: operational amplifier 126; resistance element R1; feedback ratio control circuit 162: and variable resistors 164, 166 and 168. Variable resistor 164 is coupled between first detecting circuit 3a and the inverted input terminal of operational amplifier 126 to transmit detection voltage $V_{DET1}$. Variable resistor 166 is coupled between second detecting circuit 3b and the inverted input terminal of operational amplifier 126 to transmit detection voltage $V_{DET2}$. Variable resistor 168 is coupled between the inverted input terminal of operational amplifier 126 and ground voltage GND. Resistance element R1 is connected between the inverted input terminal and the output terminal of operational amplifier 126.

Feedback ratio control circuit 162 set resistance values of variable resistors 164, 166 and 168 based on detection voltages $V_{DET1}$ and $V_{DET2}$.

Referring again to FIGS. 20A to 20B, in a range in which detection voltages $V_{DET1}$ and $V_{DET2}$ are lower than $V_{TH1}$, detection voltage feedback ratios $K_1$ and $K_2$ are both set to 0. That is, in this range, feedback ratio control circuit 162 sets resistance values of variable resistors 164 and 166 to the maximum value (∞, ideally). As a result, a non-inverting amplifier is constituted of operational amplifier 126, resistance element R1 and variable resistor 168, and control voltage $V_C$ is set based on open loop control. Resistance element R1 and a resistance value of variable resistor 168 is designed so that prescribed control voltage feedback ratio K' is obtained.

In a range in which detection voltages $V_{DET1}$ and $V_{DET2}$ are higher than $V_{TH1}$, a resistance value of variable resistor 168 is set to the maximum value (∞, ideally) to change over from open loop control based on reference voltage $V_{REF}$ to close loop control with negative-feedback of a detection voltage.

In a range, which corresponds to a region in the vicinity of a changeover boundary region between open loop control and close loop control, and in which a detection voltage is $V_{TH1}<V_{DET1}<V_{TH2}$, a resistance value variable resistor 164 is set so that feedback ratio $K_1$ gradually increases continuously.

Furthermore, when detection voltage $V_{DET1}$ is higher than threshold voltage $V_{TH2}$, a resistance value of variable resistor 164 is set so that feedback ratio $K_1$ is prescribed detection voltage feedback ratio $K_0$ in a range of $V_{TH2}<V_{DET1}<V_{TH3}$ of a detection voltage. On the other hand, in a range of $V_{DET2}<V_{TH3}$, a resistance value of variable resistor 166 is set to the maximum value (∞, ideally) so that feedback ratio $K_2$ is 0.

In a range in which detection voltages $V_{DET1}$ and $V_{DET2}$ are higher than threshold voltage $V_{TH3}$ but lower than $V_{TH4}$, resistance values of variable resistors 164 and 166 are set so that as a detection voltage goes higher, feedback ratio $K_1$ gradually decreases and in addition, feedback ratio $K_2$ gradually increases. That is, in a measurable range in which overlapping occurs between a plurality of detecting circuits, a detection voltage feedback ratio is set similarly to the third embodiment. Therefore, in this range, similar to the third embodiment, outputs of a plurality of detecting circuits are synthesized and negative-feedback is implemented. Furthermore, sudden changeover between synthesis ratios does not occur but a synthesis ratio gradually changes.

With such an architecture adopted, in a range which does not belong to any of measurable ranges of detecting circuits 3a and 3b, control voltage $V_C$, that is a gain of variable gain amplifier 1, can be set by open loop control based on reference voltage $V_{REF}$, that is transmission power designated value $P_{CMD}$.

When actual transmission power $P_{OUT}$ corresponds to a measurable range of one of detecting circuits, similar to the transmission power control circuit according to the third embodiment, implementation can be realized of close loop control with a detection voltage for ensuring a wide dynamic range of a transmission power without increasing a measurable range of each detecting circuit, that is by using a plurality of general inexpensive detecting circuits. Furthermore, a sudden change in transmission power in changeover between mainly used detecting circuits can be prevented according to a relationship between a measurable voltage of each detecting circuit and a detection voltage.

First Modification of Fourth Embodiment

Figure 21:
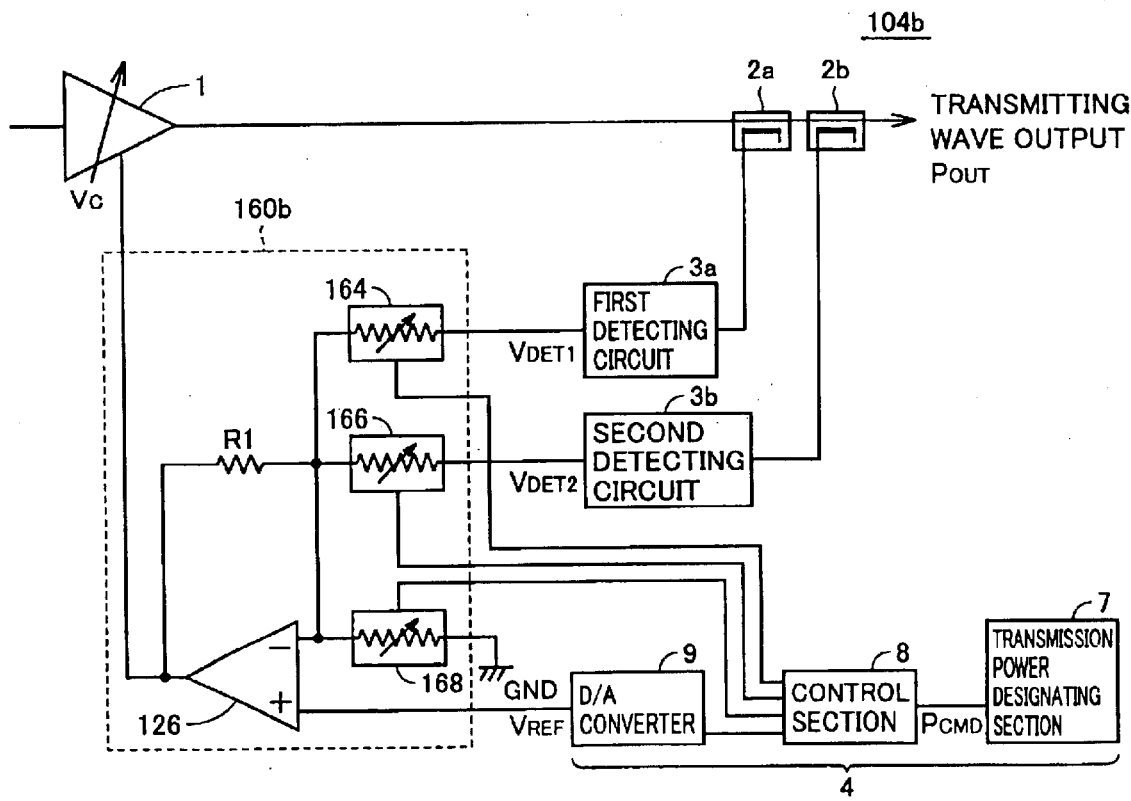
FIG. 21 is a block diagram showing an architecture of a transmission power control circuit according a first modification of the fourth embodiment.

Referring to FIG. 21, transmission power control circuit 104b according to a first modification of the fourth embodiment is different from transmission power control circuit 104a shown in FIG. 18 in comparison in that a power control section 160b is included as constituent instead of power control section 160a.

Power control section 160b is different from power control section 160a shown in FIG. 19 in that feedback control circuit 162 is omitted as constituent. In power control section 160b, resistance values of variable resistors 164, 166 and 168 are controlled by control section 8. Control section 8 sets resistance values of variable resistors 164, 166 and 168 according to transmission power designated value $P_{CMD}$ from transmission power designating section 7 so that detection voltage feedback ratios $K_1$ and $K_2$ change as shown in FIGS. 20A and 20B according to a detection voltage.

Figure 22A:
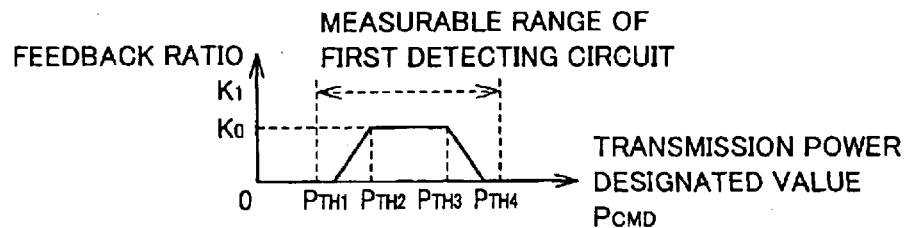
FIGS. 22A and 22B are conceptual graphs for describing setting of a detection voltage feedback ratio by a power control section shown in FIG. 21.
Figure 22B:
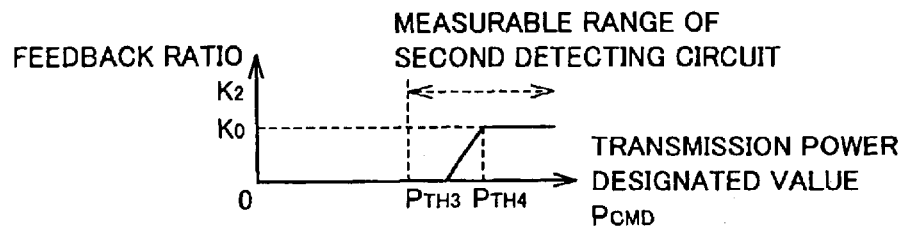

Referring to FIGS. 22A and 22B, threshold voltages $P_{TH1}$, $P_{TH2}$, $P_{TH3}$ and $P_{TH4}$ are determined correspondingly to measurable ranges of detecting circuits 3a and 3b.

A measurable range of detecting circuit 3a is determined correspondingly to a range of $P_{TH1}<P_{CMD}<P_{TH4}$ of transmission power designated value $P_{CMD}$. On the other hand, a measurable range of detecting circuit 3b is determined correspondingly to a range of $P_{CMD}>P_{TH3}$ of transmission power designated value $P_{CMD}$. Overlapped measurable ranges of detecting circuits 3a and 3b are determined according to a range of $P_{TH3}<P_{CMD}<P_{TH4}$.

Control section 8 sets detection voltage feedback ratios $K_1$ in $K_2$ not according to a detection voltage but according to transmission power designated value $P_{CMD}$. Setting of detection voltage feedback ratios $K_1$ and $K_2$ by control section 8 corresponds to replacement of $V_{TH1}$, $V_{TH2}$, $V_{TH3}$ and $V_{TH4}$ with threshold voltages $P_{TH1}$, $P_{TH2}$, $P_{TH3}$ and $P_{TH4}$.

Therefore, control section 8, in a range in which transmission power designated value $P_{CMD}$ is lower than $P_{TH1}$, sets detection voltage feedback ratios $K_1$ and $K_2$ to 0 and control voltage $V_C$ is set only based on open loop control based on reference voltage $V_{REF}$.

On the other hand, control circuit 8, in a range in which transmission power designated value $P_{CMD}$ is higher than $P_{TH1}$, sets a resistance value of variable resistor 168 to the maximum value (∞, ideally) and changes over from open loop control based on reference voltage $V_{REF}$ to close loop control by negative-feedback of a destruction voltage.

In a range corresponding to a region in the vicinity of changeover boundary region between open loop control and close loop control, in which transmission power designated value $P_{CMD}$ is $P_{TH1}<P_{CMD}<P_{TH2}$, a resistance value of variable resistor 164 is set so that feedback ratio $K_1$ gradually increase. In overlapping measurable ranges ($P_{TH3}<P_{CMD}<P_{TH4}$) between a plurality of detecting circuits, similar to the third embodiment, outputs of a plurality of detection circuits are synthesized and negative-feedback is performed. Moreover, a synthesis ratio gradually changes.

In such a way, in transmission power control circuit 104b according to the first modification of the fourth embodiment, which is a detecting circuit corresponding to actual transmission power $P_{OUT}$ is determined according to transmission power designated value $P_{CMD}$. With such an architecture adopted, while reduction occurs in a precision in determination on which one of detecting circuits has a measurable range corresponding to actual transmission power $P_{OUT}$, no necessity arises for a circuit (feedback control circuit 162 shown FIG. 19) performing determination based on destruction voltages $V_{DET1}$ and $V_{DET2}$, enabling simplification of a circuit architecture for implementing transmission power control similar to the second embodiment.

While in the fourth embodiment and the first modification thereof as well, the architectures are shown in which there are used variable resistors 164, 166 and 168, resistance values all changing in an analog fashion, the variable resistors may be of types whose resistance values change gradually stepwise.

Second Example of the Fourth Embodiment

Figure 23:
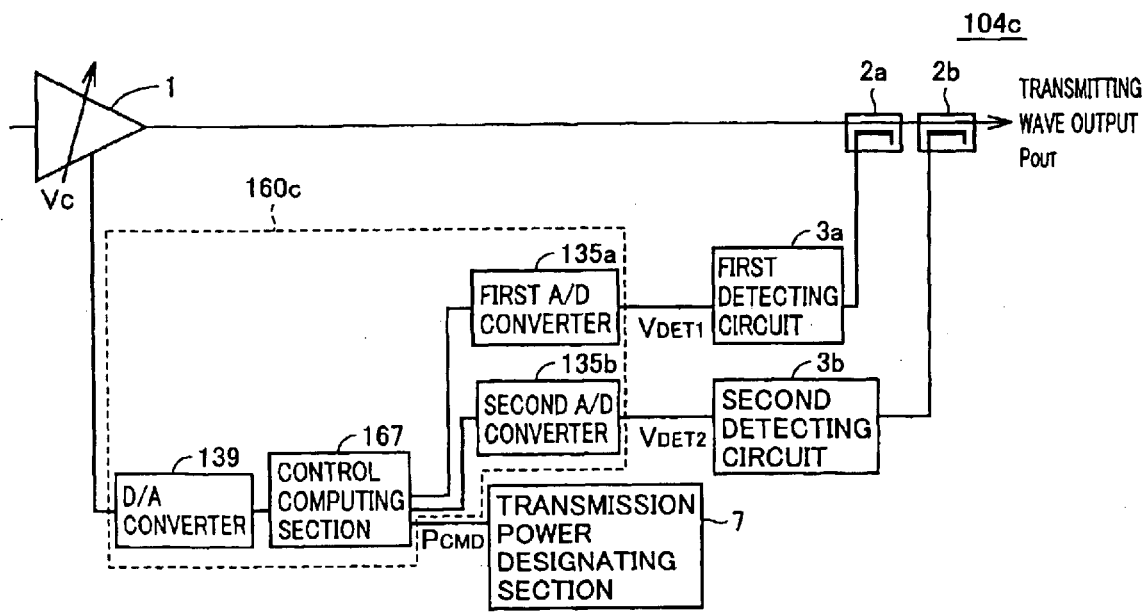
FIG. 23 is a block diagram showing an architecture of a transmission power control circuit according a second modification of the third embodiment of the present invention.

Referring to FIG. 23, a transmission power control circuit 104c according to a second modification of the fourth embodiment is different from transmission power control circuit 104a according to the fourth embodiment in comparison in that a power control section 160c is included as constituent instead of power control section 160a. Furthermore, control section 8 and D/A converter 9 are omitted and transmission power designating value $P_{CMD}$ from transmission power designating section 7 is given directly to power control section 160c as a digital signal as is.

Power control section 160c has a first A/D converter 135a; a second A/D converter 135b; a control computing section 167; and a D/A converter 139.

First A/D converter 135a and second A/D converter 135b are provided corresponding to first detecting circuit 3a and second detecting circuit 3b, respectively, to convert detection voltages $V_{DET1}$ and $V_{DET2}$ to respective digital signals.

Control arithmetic logic section 167 receives digital signals corresponding to detection voltages $V_{DET1}$ and $V_{DET2}$ and transmission power designating value $P_{CMD}$ as an digital signal unchanged performs a digital computing based on detection voltage feedback ratios $K_1$ and $K_2$ similarly to FIGS. 22A and 22B. That is, in control computing section 167, there are performed a control operation similar to power control section 160b constructed as an analog circuit. A result of the operation of control computing section 167 is converted to an analog signal by D/A converter 139 and transmitted as control voltage $V_C$ to variable gain amplifier 1.

With such an architecture adopted, in the second modification of the fourth embodiment, detection voltages $V_{DET1}$ and $V_{DET2}$ are converted to respective digital signals and close loop control is realized based on a digital computing, thereby enabling realization of transmission power control similar to the first modification of the fourth embodiment.

Note that while in the fourth embodiment and the first and second modifications thereof, the architectures are described in which there are included as constituent two detecting circuits having respective different measurable ranges, three or more detecting circuits can also be used. In this case, a pair of a distributor and a variable resistor is required to be provided corresponding to each detection circuit. Similarly, while the example architecture is shown in which the minimum range of a transmission power is changed over to open loop control, a section applied with an open loop can be set corresponding to any power range.

It should be understood that the embodiments disclosed this time are presented by way of illustration but not to be taken by way of limitation in all aspects. The scope of the present invention is shown not by the above descriptions but the appended claims, and all changes or modifications that falls within bounds of the claims or equivalence of the bounds are intended to be embraced by the claims.

INDUSTRIAL APPLICABILITY

A transmission power control circuit according to the present invention can be applied to a wireless communication apparatus such as a portable telephone.

What is claimed is:

1. A transmission power control circuit comprising:
   a variable gain amplifier (1) for amplifying a transmission signal with a gain according to a control voltage ($V_C$) to output a transmitting wave;
   a distributing section (2) for taking out a part of said transmitting wave;
   a detecting section (3) for detecting an output of said distributing section to generate a detection voltage ($V_{DET}$) corresponding to a transmission power ($P_{OUT}$) of said transmitting wave; and
   a control section (120a, 120b, 120c, 140a, 140b, 140c) for receiving an electrical signal indicating a designated level ($P_{CMD}$) of said transmission power and said detection voltage to set said control voltage, wherein
   said control section performs a changeover between a first control state of setting said control voltage by dose loop control according to the detection voltage negative-fed back by multiplied by a feedback ratio (K) and a reference voltage corresponding to said designated level, and a second control state of setting said control voltage by open loop control according to said designated level, according to a relationship between a measurable power range of said detecting section and said transmission power.

2. The transmission power control circuit according to claim 1, wherein
   said control section (120a, 140a) performs the changeover between said first and second control states according to said detection voltage ($V_{DET}$).

3. The transmission power control circuit according to claim 1, wherein
   said control section (120a, 140a) performs the changeover between said first and second control states according to the designated level $P_{CMD}$) of said transmission power.

4. The transmission power control circuit according to claim 1, wherein
   said control section (120c, 140) includes:
   a first signal converting section (135) converting said detection voltage ($V_{DET}$) to a first digital signal;
   a control computing section (137, 147) receiving a second digital signal indicating the designated level ($P_{CMD}$) of said transmission power and said first digital signal to perform a digital computing for setting said control voltage based on one of said first and second control state, which is selected according to comparison between said first and second digital signals; and
   a second signal converting section (139) converting an output of said control computing section to an analog signal to generate said control voltage ($V_C$).

5. The transmission power control circuit according to claim 1, wherein
   said control section (140a, 140b, 140c) includes:
   a feedback ratio adjusting section (8, 142, 147) for gradually reducing said feedback ratio (K) from a prescribed level ($K_0$) as said transmission power ($P_{OUT}$) comes closer to a non-measurable power range in a prescribed boundary range between the measurable power range and said non-measurable power range of said detection section in said first control state.

6. The transmission power control circuit according to claim 5, wherein
   said feedback ratio adjusting section (142) changes said feedback ratio (K) according to said detection voltage ($V_{DET}$).

7. The transmission power control circuit according to claim 5, wherein
   said feedback ratio adjusting section (8) changes said feedback ratio (K) according to the designated level ($P_{CMD}$) of said transmission power.

8. The transmission power control circuit according to claim 5, wherein
   said control section (140c) further includes:
   a first signal converting section (135) converting said detection voltage ($V_{DET}$) to a first digital signal; and
   a second signal converting section (139) converting an output of said feedback ratio adjusting section (147) to an analog signal to generate said control voltage ($V_C$), and
   said feedback ratio adjusting section (147) receives a second digital signal indicating the designated level ($P_{CMD}$) of said transmission power and said first digital signal to perform a digital computing for setting said control voltage based on said feedback ratio (K) set according to the second digital signal.

9. A transmission power control circuit comprising:
   a variable gain amplifier (1) for amplifying a transmission signal with a gain according to a control voltage ($V_C$) to output a transmitting wave;
   a plurality of distributing sections (2a to 2c) for taking out a part of said transmitting wave;
   a plurality of detecting sections (3a to 3c) provided corresponding to said respective plurality of distributing sections, respectively, and having different measurable power ranges,
   said plurality of detecting sections detecting outputs of the corresponding distributing sections to generate a plurality of detection voltages ($V_{DET1}$ to $V_{DET3}$) according to a transmission power ($P_{OUT}$) of said transmitting wave; and
   a control section (150a, 150b, 150c, 160a, 160b, 160c) for receiving an electrical signal indicating a designated level ($P_{CMD}$) of said transmission power and said plurality of detection voltages to set said control voltage, wherein
   said control section includes a feedback ratio control section (8, 152, 157, 162, 167) setting a plurality of feedback ratios ($K_1$ to $K_3$) corresponding to said plurality of detection voltages, respectively, according to a relationship between the measurable power ranges of said plurality of detecting sections and said transmission power, and
   said control section sets said control voltage according to close loop control based on the plurality of detection voltages negative-fed back multiplying said plurality of feedback ratios, respectively, and a reference voltage ($V_{REF}$) corresponding to the designated level of said transmission power.

10. The transmission power control circuit according to claim 9, wherein the measurable power ranges of at least a part of said plurality of detecting sections (3a to 3c) share an overlapped range with each other, said feedback ratio control section (8, 152, 157, 162, 167), when the transmission power of said transmitting wave corresponds to said overlapped range, sets said plurality of feedback ratios ($K_1$ to $K_3$) so that the detecting voltages from the detecting circuits sharing said overlapped range are synthesized and negative-fed back.

11. The transmission power control circuit according to claim 10, wherein said feedback ratio control section (8, 152, 157, 162, 167), when the transmission power of said transmitting wave corresponds to said overlapped range, sets said plurality of feedback ratios ($K_1$ to $K_3$) so that a synthesis ratio between the plurality of detecting voltages to be synthesized gradually change according to said transmission power.

12. The transmission power control circuit according to claim 9, wherein said feedback ratio adjusting section (152, 162) sets said plurality of feedback ratios ($K_1$ to $K_3$) according to said plurality of detection voltages ($V_{DET1}$ to $V_{DET3}$).

13. The transmission power control circuit according to claim 9, wherein said feedback ratio adjusting section (8) sets said plurality of feedback ratios ($K_1$ to $K_3$) according to the designated level ($P_{CMD}$) of said transmission power.

14. The transmission power control circuit according to claim 9, wherein said control section (150c) further includes:

a first signal converting section (135a to 135c) for converting said plurality of detection voltages ($V_{DET1}$ to $V_{DET3}$) to a plurality of first digital signals; and a second signal converting section (139) converting an output of said feedback ratio adjusting section (157, 167) to an analog signal to generate said control voltage ($V_C$), and said feedback ratio adjusting section (157, 167) receives a second digital signal indicating the designated level ($P_{CMD}$) of said transmission power and said plurality of first digital signals to perform a digital computing for setting said control voltage based on said plurality of feedback ratios ($K_1$ to $K_3$) set according to said plurality of second digital signals.

15. The transmission power control circuit according to claim 9, wherein said control section (160a, 160b, 160c), when said transmission power does not belong to any of the measurable power ranges of said plurality of detecting sections, ceases said close loop control and sets said control voltage ($V_C$) based on open loop control corresponding to the designated level ($P_{CMD}$) of said transmission power.

16. The transmission power control circuit according to claim 15, wherein said control section (160a) performs a changeover between said close loop control and said open loop control and setting of the plurality of feedback ratios ($K_1$ to $K_3$) in said close loop control according to said plurality of detection voltages ($V_{DET1}$ to $V_{DET3}$).

17. The transmission power control circuit according to claim 15, wherein said control section (160b) performs a changeover between said close loop control and said open loop control and setting of the plurality of feedback ratios $K_1$ to $K_3$) in said close loop control, according to the designated level ($P_{CMD}$) of said transmission power.

18. The transmission power control circuit according to claim 15, wherein said control section (160c) further includes:

a first signal converting section (135a to 135c) converting said plurality of detection voltages ($V_{DET1}$ to $V_{DET3}$) to a plurality of first digital signals, respectively; and a second signal converting section (139) converting an output of said feedback ratio adjusting section (167) to an analog signal to generate said control voltage ($V_C$), and said feedback ratio adjusting section (167) receives a second digital signal indicating the designated level ($P_{CMD}$) of said transmission power and said plurality of first digital signals to perform a digital computing for setting said control voltage using said plurality of feedback ratios ($K_1$ to $K_3$) set according to said plurality of second digital signals, based on one of said open loop control and said close loop control, which is selected according to comparison between said first and second digital signals.

* * * * *